United States Patent
Tange et al.

(10) Patent No.: US 8,058,845 B2
(45) Date of Patent: Nov. 15, 2011

(54) BATTERY STATE MONITORING CIRCUIT AND BATTERY APPARATUS

(75) Inventors: Yoshihisa Tange, Chiba (JP); Atsushi Sakurai, Chiba (JP); Takakazu Ozawa, Chiba (JP); Kiyoshi Yoshikawa, Chiba (JP)

(73) Assignee: Seiko Instruments Inc. (JP)

( * ) Notice: Subject to any disclaimer, the term of this patent is extended or adjusted under 35 U.S.C. 154(b) by 803 days.

(21) Appl. No.: 12/217,316

(22) Filed: Jul. 3, 2008

(65) Prior Publication Data
US 2009/0009133 A1    Jan. 8, 2009

(30) Foreign Application Priority Data
Jul. 6, 2007   (JP) .................. 2007-178835

(51) Int. Cl.
*H01M 10/46* (2006.01)
(52) U.S. Cl. .......................... 320/134; 320/136
(58) Field of Classification Search .................. 320/103, 320/114, 116, 117, 132, 134, 136, 149; 324/426, 324/427, 430, 433
See application file for complete search history.

(56) References Cited

U.S. PATENT DOCUMENTS

| | | | | |
|---|---|---|---|---|
| 5,304,915 A | * | 4/1994 | Sanpei et al. | 320/116 |
| 5,789,900 A | * | 8/1998 | Hasegawa et al. | 320/132 |
| 5,808,444 A | * | 9/1998 | Saeki et al. | 320/117 |
| 5,825,155 A | * | 10/1998 | Ito et al. | 320/118 |
| 5,929,593 A | * | 7/1999 | Eguchi | 320/139 |
| 6,340,880 B1 | * | 1/2002 | Higashijima et al. | 320/162 |

OTHER PUBLICATIONS

Patent Abstracts of Japan, publication No. 2005-117780, publication date Apr. 28, 2005.

* cited by examiner

*Primary Examiner* — Edward Tso
(74) *Attorney, Agent, or Firm* — Adams & Wilks

(57) ABSTRACT

Provided is a battery state monitoring circuit which is capable of preventing a discharge leak current from a battery so as to eliminate a load conventionally imposed on a user, including: a battery state detector circuit that detects a state of the battery based on a voltage of the battery; a transmitting terminal that transmits battery state information indicative of the state of the battery to an outside; a receiving terminal that receives battery state information of another battery from the outside; a transistor that is used for transmitting the battery state information, and has any one of two terminals except for a control terminal connected to the transmitting terminal; and a diode that is connected in a direction opposite to a direction of a parasitic diode disposed between the two terminals of the transistor, the diode being disposed between the transmitting terminal and one terminal of the transistor.

18 Claims, 15 Drawing Sheets

BATTERY STATE MONITORING CIRCUIT AND BATTERY APPARATUS

BACKGROUND OF THE INVENTION

1. Field of the Invention

The present invention relates to a battery state monitoring circuit that monitors a state of a battery, and a battery device that is equipped with a plurality of the battery state monitoring circuits.

2. Description of the Related Art

For example, JP 2005-117789 A discloses a protective IC that monitors voltages of a plurality of batteries that are connected in series with each other. FIG. 15A shows an example of the protective IC that is disclosed in JP 2005-117780 A. Referring to FIG. 15A, reference numbers 31a, 31b, and 31c denote protective ICs, respectively. The protective IC 31a monitors the voltages of batteries 1a to 1c, the protective IC 31b monitors the voltages of batteries 1d to 1f, and the protective IC 31c monitors the voltages of batteries 1g to 1i, respectively. In a normal state, that is, when the voltages of the batteries 1a to 1i are not abnormal, because all FETs 51, 53, and 55 of the respective protective ICs 31a, 31b, and 31c are on, a current flows through a resistor 81, and a monitor output terminal 42 becomes at high level. On the other hand, for example, when the voltage of any one of the batteries 1a to 1c becomes overvoltage (overcharged state), a signal of high level is output from an overvoltage detector circuit 34a' that is disposed in the protective IC 31a with the results that an FET 73 is turned on, and an FET 75 is turned on. In this situation, because the FET 51 is turned off, no current flows in the resistor 81, and the monitor output terminal 42 becomes at low level. The same is applied to overdischarge detection.

As described above, when the voltage of any one of the batteries 1a to 1c becomes overvoltage, the monitor output terminal 42 becomes at low level because the FET 73 is turned on, the FET 75 is turned on, and the FET 51 is turned off. However, a parasitic diode having an anode terminal connected to a drain terminal of the FET 51 and a cathode terminal connected to a source terminal of the FET 51 exists between the drain terminal and a gate terminal of the FET 51. Therefore, when a load is connected between external terminals 41 and 44 in the above state, a current path is formed as shown in FIG. 15B, which leads to such a problem that electricity is discharged from the batteries 1d to 1i to generate discharge leak current.

The voltages of the batteries 1d to 1i are decreased due to an influence of the above discharge leak current, but the other batteries 1a to 1c have the high voltage close to the overvoltage. As a result, the voltage balance of the batteries 1a to 1i is disrupted. A state in which the voltage balance is disrupted is advanced so that the batteries 1a to 1c become voltages close to the overvoltage, and the batteries 1d to 1i become voltages close to overdischarge. As a result, because the overvoltage is detected by small charge, charging cannot be conducted. Also, because the overdischarge is detected by slightly using an application program, the batteries cannot be used. Such batteries are exchanged with fresh batteries. However, because the phenomenon of the discharge leak current is repeated so far as the conventional protective IC is used, the conventional protective IC not only causes inconvenience for a user, but also causes a large load such as costs and time required for battery replacement.

SUMMARY OF THE INVENTION

The present invention has been made in view of the above circumstances, and therefore an object of the present invention is to provide a battery state monitoring circuit and a battery device which are capable of preventing the discharge leak current from the battery so as to eliminate the load conventionally imposed on the user.

In order to achieve the above-mentioned object, as means for solving the above-mentioned problems, the present invention provides a battery state monitoring circuit, including: a battery state detector circuit that detects a state of a battery based on a voltage of the battery; a transmitting terminal that transmits battery state information indicative of the state of the battery to an outside; a receiving terminal that receives battery state information of another battery from the outside; a transistor that is used for transmitting the battery state information, and has any one of two terminals except for a control terminal connected to the transmitting terminal; and a diode that is connected in a direction opposite to a direction of a parasitic diode disposed between the two terminals of the transistor, the diode being disposed between the transmitting terminal and one terminal of the transistor.

DETAILED DESCRIPTION OF THE PREFERRED EMBODIMENTS

Hereinafter, a description will be given of embodiments of the present invention with reference to the accompanying drawings.

First Embodiment

Figure 1:
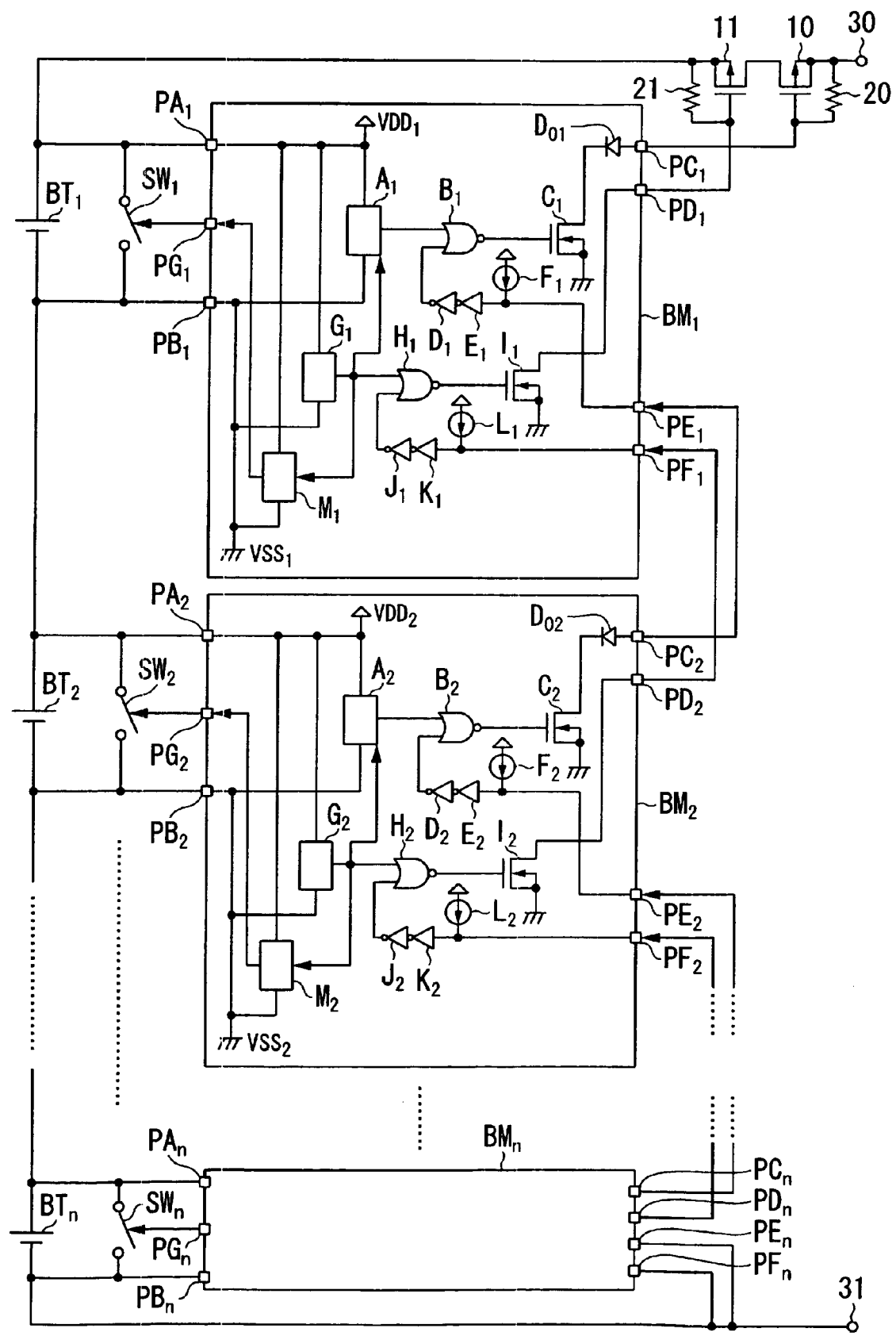
FIG. 1 is a circuit configuration diagram showing a battery device according to a first embodiment of the present invention.

FIG. 1 is a circuit configuration diagram showing a battery device according to a first embodiment. As shown in FIG. 1, the battery device according to the first embodiment includes n batteries $BT_1$ to $BT_n$, that are connected in series, n switches (cell balance switch circuits) $SW_1$ to $SW_n$ which are connected in parallel with each of the batteries $Bt_1$ to $BT_n$, n battery state monitoring circuits $BM_1$ to $BM_n$ that are disposed in correspondence with the respective batteries $BT_1$ to $BT_n$, individually, a first transistor (charging p-channel transistor) 10, a second transistor (discharging p-channel transistor) 11, a first resistive element (first bias resistive element) 20, a second resistive element (second bias resistive element) 21, a first external terminal 30, and a second external terminal 31.

The battery state monitoring circuit $BM_1$ includes an overcharge detector circuit $A_1$, a first NOR circuit $B_1$, a first output transistor $C_1$, a diode $Do_1$, a first inverter $D_1$, a second inverter $E_1$, a first current source $F_1$, an overdischarge detector circuit $G_1$, a second NOR circuit $H_1$, a second output transistor $I_1$, a third inverter $J_1$, a fourth inverter $K_1$, a second current source $L_1$, a cell balance circuit $M_1$, a first voltage monitor terminal $PA_1$, a second voltage monitor terminal $PB_1$, a first transmitting terminal $PC_1$, a second transmitting terminal $PD_1$, a first receiving terminal $PE_1$, a second receiving terminal $PF_1$, and a control terminal $PG_1$. The battery state monitoring circuit $BM_1$ having the above components is configured as an IC (semiconductor device) of one chip.

The other battery state monitoring circuits $BM_2$ to $BM_n$ have the same components as those of the battery state monitoring circuit $BM_1$, and therefore are shown with a change in only symbols. For example, the symbol of the overcharge detector circuit in the battery state monitoring circuit $BM_2$ is $A_2$ whereas the symbol of the overcharge detector circuit in the battery state monitoring circuit $BM_n$ is $A_n$. The same is applied to other components.

Since all of the battery state monitoring circuits $BM_1$ to $BM_n$ are identical in circuit configuration with each other as described above, the battery state monitoring circuit $BM_1$ corresponding to the battery $BT_1$ will be representatively described below.

In the battery state monitoring circuit $BM_1$, the first voltage monitor terminal $PA_1$ is connected to a positive terminal of the battery $BT_1$ and one terminal of the switch $SW_1$. Also, the first voltage monitor terminal $PA_1$ is connected to a positive side common power source wire within the battery state monitoring circuit $BM_1$. The second voltage monitor terminal $PB_1$ is connected to a negative terminal of the battery $BT_1$ and another terminal of the switch $SW_1$. Also, the second voltage monitor terminal $PB_1$ is connected to a negative side common power source wire within the battery state monitoring circuit $BM_1$. In the following description, the positive side common power source wire is $VDD_1$ and the negative side common power source wire is $VSS_1$ within the battery state monitoring circuit $BM_1$, and the positive side common power source wire is $VDD_2$ and the negative side common power source wire is $VSS_2$ within the battery state monitoring circuit $BM_2$. In the same manner, the positive side common power source wire is $VDD_n$ and the negative side common power source wire is $VSS_n$ within the battery state monitoring circuit $BM_n$.

The overcharge detector circuit $A_1$ has one end connected to the first voltage monitor terminal $PA_1$, and another end connected to the second voltage monitor terminal $PB_1$. The overcharge detector circuit $A_1$ detects a voltage between the first voltage monitor terminal $PA_1$ and the second voltage monitor terminal $PB_1$ (that is, voltage of battery $BT_1$). When the voltage of the battery $BT_1$ is equal to or higher than an overcharge voltage, the overcharge detector circuit $A_1$ outputs an overcharge detection signal of high level to one input terminal of the first NOR circuit $B_1$. Also, when the voltage of the battery $BT_1$ is lower than the overcharge voltage, the overcharge detector circuit $A_1$ outputs an overcharge detection signal of low level to the first NOR circuit $B_1$. Here, the overcharge voltage is an upper limit chargeable voltage. The overcharge detector circuit $A_1$ has a function of stopping the operation when the overdischarge detection signal of high level is input to the overcharge detector circuit $A_1$ from the overdischarge detector circuit $G_1$.

To the first NOR circuit $B_1$, the above overcharge detection signal and an output signal of the first inverter $D_1$ are input, and the first NOR circuit $B_1$ outputs a negative OR signal of both of those signals to a gate terminal of the first output transistor $C_1$. The first output transistor $C_1$ is an n-channel type metal oxide semiconductor (MOS) transistor. The first output transistor $C_1$ has the gate terminal connected to an output terminal of the first NOR circuit $B_1$, a drain terminal connected to a cathode terminal of the diode $Do_1$, and a source terminal connected to the $VSS_1$. The diode $Do_1$ 1 is a discharge leak current prevention diode. The diode $Do_1$ has the cathode terminal connected to the drain terminal of the first output transistor $C_1$, and an anode terminal connected to the first transmitting terminal $PC_1$.

The first inverter $D_1$ outputs a logical inversion signal of an output signal from the second inverter $E_1$ to the first NOR circuit $B_1$. The second inverter $E_1$ has an input terminal connected to the first receiving terminal $PE_1$ and an output terminal of the first current source $F_1$, and outputs a logical inversion signal of an input signal to an input terminal to the first inverter $D_1$. The first current source $F_1$ is a current source having an input terminal connected to the $VDD_1$, and the output terminal connected to the input terminal of the second inverter $E_1$ and the first receiving terminal $PE_1$.

The overdischarge detector circuit $G_1$ has one end connected to the first voltage monitor terminal $PA_1$, and another end connected to the second voltage monitor terminal $PB_1$. The overdischarge detector circuit $G_1$ detects a voltage between the first voltage monitor terminal $PA_1$ and the second voltage monitor terminal $PB_1$ (that is, voltage of battery $BT_1$). When the voltage of the battery $BT_1$ is lower than an overdischarge voltage, the overdischarge detector circuit $G_1$ outputs an overdischarge detection signal of high level to one input terminal of the second NOR circuit $H_1$, the overcharge detector circuit $A_1$, and the cell balance circuit $M_1$. Also, when the voltage of the battery $BT_1$ is equal to or higher than the overdischarge voltage, the overdischarge detector circuit $G_1$ outputs an overdischarge detection signal of low level. Here, the overdischarge voltage is a lower limit dischargeable voltage.

To the second NOR circuit $H_1$, the above overdischarge detection signal and an output signal of the third inverter $J_1$ are input, and the second NOR circuit $H_1$ outputs a negative OR signal of both of those signals to a gate terminal of the second output transistor $I_1$. The second output transistor $I_1$ is an n-channel type MOS transistor. The second output transistor $I_1$ has the gate terminal connected to an output terminal of the second NOR circuit $H_1$, a drain terminal connected to the second transmitting terminal $PD_1$, and a source terminal connected to the $VSS_1$.

The third inverter $J_1$ outputs a logical inversion signal of an output signal from the fourth inverter $K_1$ to the second NOR circuit $H_1$. The fourth inverter $K_1$ has an input terminal connected to the second receiving terminal $PF_1$ and an output terminal of the second current source $L_1$, and outputs a logical inversion signal of an input signal to the input terminal to the fourth inverter $K_1$. The second current source $L_1$ is a current source having an input terminal connected to the $VDD_1$, and the output terminal connected to the input terminal of the fourth inverter $L_1$ and the second receiving terminal $PF_1$.

The cell balance circuit $M_1$ has one end connected to the first voltage monitor terminal $PA_1$, and another end connected to the second voltage monitor terminal $PB_1$. The cell balance circuit $M_1$ detects a voltage between the first voltage monitor terminal $PA_1$ and the second voltage monitor terminal $PB_1$ (that is, voltage of battery $BT_1$). When the voltage of the battery $BT_1$ is equal to or higher than a cell balance voltage, the cell balance circuit $M_1$ outputs a cell balance signal to the switch $SW_1$ through the control terminal $PG_1$. Also, when the voltage of the battery $BT_1$ is lower than the cell balance voltage, the cell balance circuit $M_1$ outputs a cell balance signal of low level to the switch $SW_1$ through the control terminal $PG_1$. Here, the cell balance voltage is a voltage that is equal to or lower than the overcharge voltage in the case in which the battery $BT_1$ comes to a state close to the overcharged state (voltage in the case in which voltage of battery $BT_1$ is adjusted to voltages of other batteries to start to balance). The cell balance circuit $M_1$ has a function of stopping the operation when the overdischarge detection signal of high level is input to the cell balance circuit $M_1$ from the overdischarge detector circuit $G_1$.

The first transmitting terminal $PC_1$ is connected to a gate terminal of the first transistor 10 and one end of the first resistive element 20. The second transmitting terminal $PD_1$ is connected to a gate terminal of the second transistor 11 and one end of the second resistive element 21. The first receiving terminal $PE_1$ is connected to a first transmitting terminal $PC_2$ of the battery state monitoring circuit $BM_2$. The second receiving terminal $PF_1$ is connected to a second transmitting terminal $PD_2$ of the battery state monitoring circuit $BM_2$.

Also, a first receiving terminal $PE_2$ of the battery state monitoring circuit $BM_2$ is connected to a first transmitting terminal $PC_3$ of the battery state monitoring circuit $BM_3$, and a second receiving terminal $PF_2$ of the battery state monitoring circuit $BM_2$ is connected to a second transmitting terminal $PD_3$ of the battery state monitoring circuit $BM_3$. The same is applied to the battery state monitoring circuits $BM_3$ to $BM_n$, and the first receiving terminal of the battery state monitoring circuit on an upstream side (battery $BT_1$ side) is connected to the first transmitting terminal of the battery state monitoring circuit on a downstream side (battery $BT_n$ side). The second receiving terminal of the battery state monitoring circuit on the upstream side is connected to the second transmitting terminal of the battery state monitoring circuit on the downstream side. A first receiving terminal $PE_n$ and a second receiving terminal $PF_n$ of the battery state monitoring circuit $BM_n$ which is the most downstream side are connected to a negative terminal of the battery $BT_n$.

The switch $SW_1$ is connected in parallel with the battery $BT_1$, and changes over between the connection and the disconnection of the two terminals (that is, positive terminal and negative terminal of battery $BT_1$) according to the cell balance signal that is input to the switch $SW_1$ through the control terminal $PG_1$. The switch $SW_1$ is turned on, that is, changes over the two terminals to the connection state when the cell balance signal is input. The same is applied to the other switches $SW_2$ to $SW_n$.

The first transistor 10 is a p-channel type MOS transistor. The first transistor 10 has the gate terminal connected to the first transmitting terminal $PC_1$ of the battery state monitoring circuit $BM_1$ and the one end of the first resistive element 20. The first transistor 10 also has a drain terminal connected to a drain terminal of the second transistor 11, and a source terminal connected to another terminal of the first resistive element 20 and the first external terminal 30. The second transistor 11 is a p-channel type MOS transistor. The second transistor 11 has the gate terminal connected to the second transmitting terminal $PD_1$ of the battery state monitoring circuit $BM_1$ and the one end of the second resistive element 21. The second transistor 11 also has the drain terminal connected to the drain terminal of the first transistor 10, and a source terminal connected to another terminal of the second resistive element 21 and the positive terminal of the battery $BT_1$. On the other hand, the second external terminal 31 is connected to the negative terminal of the battery $BT_n$ on the most downstream side.

In the battery device configured as described above, a load or a charger is connected between the first external terminal 30 and the second external terminal 31 to conduct discharging or charging.

Subsequently, a description will be given of the operation of the battery device according to the first embodiment, which is configured as described above.

(Normal State)

First, a description will be given of a normal state, that is, a case in which all the voltages of the batteries $BT_1$ to $BT_n$ are lower than the overcharge voltage, and equal to or higher than the overdischarge voltage. In the normal state thus defined, the overcharge detector circuit $A_1$ of the battery state monitoring circuit $BM_1$ outputs the overcharge detection signal of low level to the first NOR circuit $B_1$.

In this situation, a first output transistor $C_2$ of the battery state monitoring circuit $BM_2$ is on (the reason will be described later). As a result, the input terminal of the second inverter $E_1$ of the battery state monitoring circuit $BM_1$ is at low level, and the output signal of low level is output from the first inverter $D_1$ to the first NOR circuit $B_1$. Because, to the first NOR circuit $B_1$, the overcharge detection signal of low level and the output signal of low level of the first inverter $D_1$ are input, the first NOR circuit $B_1$ outputs the negative OR signal of high level to the gate terminal of the first output transistor $C_1$. As a result, because the first output transistor $C_1$ is turned on, the first transmitting terminal $PC_1$ becomes at low level, and the first transistor 10 is turned on.

Now, the reason why the first output transistor $C_2$ of the battery state monitoring circuit $BM_2$ is on will be described below. Because the first receiving terminal $PE_n$ of the battery state monitoring circuit $BM_n$ on the most downstream side is connected to the negative terminal of the battery $BT_n$, an input terminal of a second inverter $E_n$ is always held at low level. Accordingly, a first inverter $D_n$ always outputs the output signal of low level to a first NOR circuit $B_n$, and the overcharge detector circuit $A_n$ outputs the overcharge detection signal of low level to the first NOR circuit $B_n$. With the above arrangement, the first NOR circuit $B_n$ outputs the negative OR signal of high level to a gate terminal of a first output transistor $C_n$, and the first output transistor $C_n$ of the battery state monitoring circuit $BM_n$ is turned on.

As a result, an input terminal of a second inverter $E_{n-1}$ in the battery state monitoring circuit $BM_{n-1}$ becomes at low level, and the output signal of low level is output to a first NOR circuit $B_{n-1}$ from a first inverter $D_{n-1}$. On the other hand, since an overcharge detector circuit $A_{n-1}$ outputs the overcharge detection signal of low level to the first NOR circuit $B_{n-1}$, the first NOR circuit $B_{n-1}$ outputs the negative OR signal of high level to a gate terminal of a first output transistor $C_{n-1}$. As a result, the first output transistor $C_{n-1}$ of the battery state monitoring circuit $BM_{n-1}$ is turned on.

The above operation is repeated in the upstream side battery state monitoring circuit and the downstream side battery state monitoring circuit, and the first output transistor $C_2$ of the battery state monitoring circuit $BM_2$ is turned on.

Also, in the above normal state, the overdischarge detector circuit $G_1$ of the battery state monitoring circuit $BM_1$ outputs the overdischarge detection signal of low level to the second NOR circuit $H_1$. In this situation, because a second output transistor $I_2$ of the battery state monitoring circuit $BM_2$ is also on, the input terminal of the fourth inverter $K_1$ of the battery state monitoring circuit $BM_1$ becomes at low level, and the output signal of low level is output to the second NOR circuit $H_1$ from the third inverter $J_1$. Because, to the second NOR circuit $H_1$, the overdischarge detection signal of low level and the output signal of low level of the third inverter $J_1$ are input, the second NOR circuit $H_1$ outputs the negative OR signal of high level to the gate terminal of the second output transistor $I_1$. As a result, because the second output transistor $I_1$ is turned on, the second transmitting terminal $PD_1$ becomes at low level, and the second transistor 11 is turned on.

As described above, in the normal state, because the first transistor 10 and the second transistor 11 are turned on, the battery device is chargeable and dischargeable.

(Overcharged State)

Subsequently, a description will be given of an overcharged state, that is, a case in which a charger is connected between the first external terminal 30 and the second external terminal 31 to charge the batteries $BT_1$ to $BT_n$, and at least one voltage of those batteries $BT_1$ to $BT_n$ becomes equal to or higher than the overcharge voltage. In the following description, it is assumed that the voltage of the battery $BT_2$ is equal to or higher than the overcharge voltage.

In this case, the overcharge detector circuit $A_2$ of the battery state monitoring circuit $BM_2$ outputs the overcharge detection signal of high level to a first NOR circuit $B_2$. In this situation, because the output signal of low level is output from a first inverter $D_2$, the first NOR circuit $B_2$ outputs the negative OR signal of low level to a gate terminal of the first output transistor $C_2$. As a result, the first output transistor $C_2$ is turned off.

That is, the input terminal of the second inverter $E_1$ is pulled up to high level by means of the first current source $F_1$ and the output signal of high level is output to the first NOR circuit $B_1$ from the first inverter $D_1$. On the other hand, because the overcharge detector circuit $A_1$ outputs the overcharge detection signal of low level to the first NOR circuit $B_1$, the first NOR circuit $B_1$ outputs the negative OR signal of low level to the gate terminal of the first output transistor $C_1$. As a result, the first output transistor $C_1$ is turned off.

As described above, when the first output transistor $C_1$ is turned off, the gate terminal of the first transistor 10 becomes at high level by means of the first resistive element 20, and the first transistor 10 is turned off. As a result, the charging from the charger is prohibited.

In the above description, it is assumed that the voltage of the battery $BT_2$ is equal to or higher than the overcharge voltage. The same is applied to a case in which the voltages of the other batteries are equal to or higher than the overcharge voltage. That is, a fact that the overcharged state occurs is communicated from the battery state monitoring circuit corresponding to the battery that has become in the overcharged state to the upstream side battery state monitoring circuit, and the communication reaches the most upstream side battery state monitoring circuit $BM_1$. As a result, the first transistor 10 is turned off to prohibit the charging from the charger.

(Overdischarged State)

Subsequently, a description will be given of an overdischarged state, that is, a case in which a load is connected between the first external terminal 30 and the second external terminal 31 to discharge the batteries $BT_1$ to $BT_n$, and at least one voltage of those batteries $BT_1$ to $BT_n$ becomes lower than the overdischarge voltage. In the following description, it is assumed that the voltage of the battery $BT_2$ is lower than the overdischarge voltage.

In this case, an overdischarge detector circuit $G_2$ of the battery state monitoring circuit $BM_2$ outputs the overdischarge detection signal of high level to a second NOR circuit $H_2$. In this situation, because the output signal of low level is output from a third inverter $J_2$, the second NOR circuit $H_2$ outputs the negative OR signal of low level to a gate terminal of the second output transistor $I_2$. As a result, the second output transistor $I_2$ is turned off.

That is, the input terminal of the fourth inverter $K_1$ is pulled up to high level by means of the second current source $L_1$, and the output signal of high level is output to the second NOR circuit $H_1$ from the third inverter $J_1$. On the other hand, because the overdischarge detector circuit $G_1$ outputs the overdischarge detection signal of low level to the second NOR circuit $H_1$, the second NOR circuit $H_1$ outputs the negative OR signal of low level to the gate terminal of the second output transistor $I_1$. As a result, the second output transistor $I_1$ is turned off.

As described above, when the second output transistor $I_1$ is turned off, the gate terminal of the second transistor 11 becomes at high level by means of the second resistive element 21, and the second transistor 11 is turned off. As a result, the discharging to the load is prohibited.

Also, in the above overdischarge state, the overdischarge detector circuit $G_2$ that has detected the overdischarged state outputs the overdischarge detection signal of high level to the overcharge detector circuit $A_2$ and a cell balance circuit $M_2$. With the above configuration, because the overcharge detector circuit $A_2$ and the cell balance circuit $M_2$ stop the operation, it is possible to reduce the power consumption. Also, a first voltage monitor terminal $PA_2$ also functions as a VDD power source terminal of the battery state monitoring circuit $BM_2$, and the battery state monitoring circuit $BM_2$ receives a power from the battery $BT_2$. As a result, the voltage of the overdischarged battery $BT_2$ becomes low, and the power consumption of the battery state monitoring circuit $BM_2$ is reduced as much.

In this example, when the characteristic variation occurs in the respective batteries to decrease the voltage of the battery $BT_2$ earlier than the voltages of the other batteries during discharging, the overdischarge detector circuit $G_2$ of the battery state monitoring circuit $BM_2$ outputs the overdischarge detection signal earlier than other battery state monitoring circuits. Then, the second transistor 11 is turned off to prohibit the discharging. In this situation, in the battery state monitoring circuit $BM_2$, the power consumption is reduced more than those of the other battery state monitoring circuits. The battery $BT_2$ is lower than the other batteries in discharge speed as much as the power consumption is reduced, and the other batteries discharge electricity in the usual manner.

Therefore, since the discharge speed of the overdischarged battery $BT_2$ becomes low, the battery device is capable of conforming the voltages of the respective batteries to each other (taking cell balance).

In the above description, it is assumed that the voltage of the battery $BT_2$ is lower than the overdischarge voltage. The same is applied to a case in which the voltages of the other batteries are lower than the overdischarge voltage. That is, a fact that the overdischarged state occurs is communicated from the battery state monitoring circuit corresponding to the battery that has become in the overdischarged state to the upstream side battery state monitoring circuit, and the communication reaches the most upstream side battery state monitoring circuit $BM_1$. As a result, the second transistor 11 is turned off to prohibit the discharging to the load.

(Cell Balance State)

Subsequently, a description will be given of a cell balance state, that is, a case in which a charger is connected between the first external terminal 30 and the second external terminal 31 to charge the batteries $BT_1$ to $BT_n$, and at least one voltage of those batteries $BT_1$ to $BT_n$ becomes equal to or higher than the cell balance voltage. In the following description, it is assumed that the voltage of the battery $BT_2$ is equal to or higher than the cell balance voltage.

In this case, the cell balance circuit $M_2$ of the battery state monitoring circuit $BM_2$ outputs the cell balance signal to the switch $SW_2$ through a control terminal $PG_2$. With the above configuration, the switch $SW_2$ is turned on, and the charged battery $BT_2$ discharges electricity through the switch $SW_2$.

In this example, when the characteristic variation occurs in the respective batteries to increase the voltage of the battery $BT_2$ earlier than the voltages of the other batteries during charging, the battery state monitoring circuit $BM_2$ outputs the cell balance signal earlier than the other battery state monitoring circuits. Then, the switch $SW_2$ is turned on earlier than the other switches, and the battery $BT_2$ is different from the other batteries in change in amount of charge. For example, the battery $BT_2$ is lower in charging speed than the other batteries, and the other batteries are charged in the usual manner. Alternatively, the battery $BT_2$ is discharged, and the other batteries are charged in the usual manner. As a result, since the charging speed of the overcharged battery $BT_2$ becomes low, or since the overcharged battery $BT_2$ is discharged, the battery device is capable of taking the cell balance.

Figure 2:
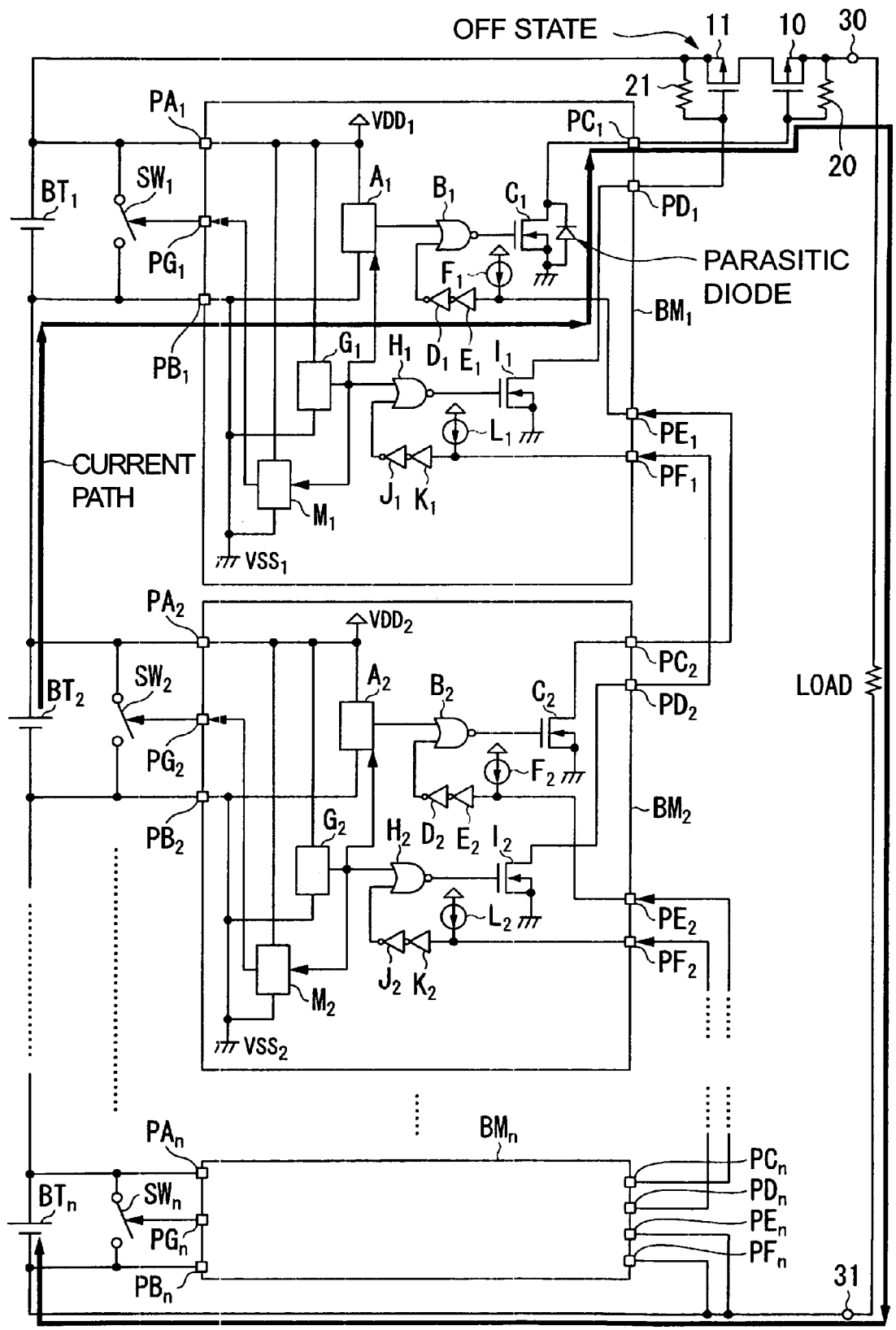
FIG. 2 is an explanatory diagram showing a discharge leak current preventing principle in the battery device according to the first embodiment of the present invention.

Hereinafter, a description will be given of the reason why the discharge leak current can be prevented with the provision of the diode $Do_1$ in the battery state monitoring circuit $BM_1$ on the premise of the above operation. FIG. 2 shows the circuit configuration of the battery device in which no diode $Do_1$ is provided. For example, in FIG. 2, it is assumed that the battery $BT_1$ is overdischarged during the discharging to the load, and the second transistor 11 is turned off. In this case, the first output transistor $C_1$ of the most upstream side battery state monitoring circuit $BM_1$ becomes off. However, because a parasitic diode having a cathode terminal on the drain side and an anode terminal on the source side exists between the drain terminal and the gate terminal of the first output transistor $C_1$, a current path is formed as shown in FIG. 2. As a result, the electric discharge of the batteries $BT_2$ to $BT_n$ does not stop, thereby causing the discharge leak current to occur. On the other hand, according to the battery state monitoring circuit $BM_1$ of the first embodiment, because the diode $Do_1$ of a direction opposite to the parasitic diode of the first output transistor $C_1$ is provided, it is possible to prevent the discharge leak current shown in FIG. 2 from occurring.

As described above, in the battery device according to the first embodiment, the occurrence of the discharge leak current can be prevented, and the disruption of the voltage balance between the batteries as in the conventional technology does not occur. As a result, it is possible to eliminate the load on the user, such as the costs and time required for battery exchange.

Second Embodiment

Subsequently, a description will be given of a battery device according to a second embodiment. In the above first embodiment, the description is given of a case in which the n-channel type MOS transistors are used as the first output transistor and the second output transistor in the battery state monitoring circuit. In contrast, in the second embodiment, a description will be given of a battery device in the case where p-channel type MOS transistors are used as the first output transistor and the second output transistor.

Figure 3:
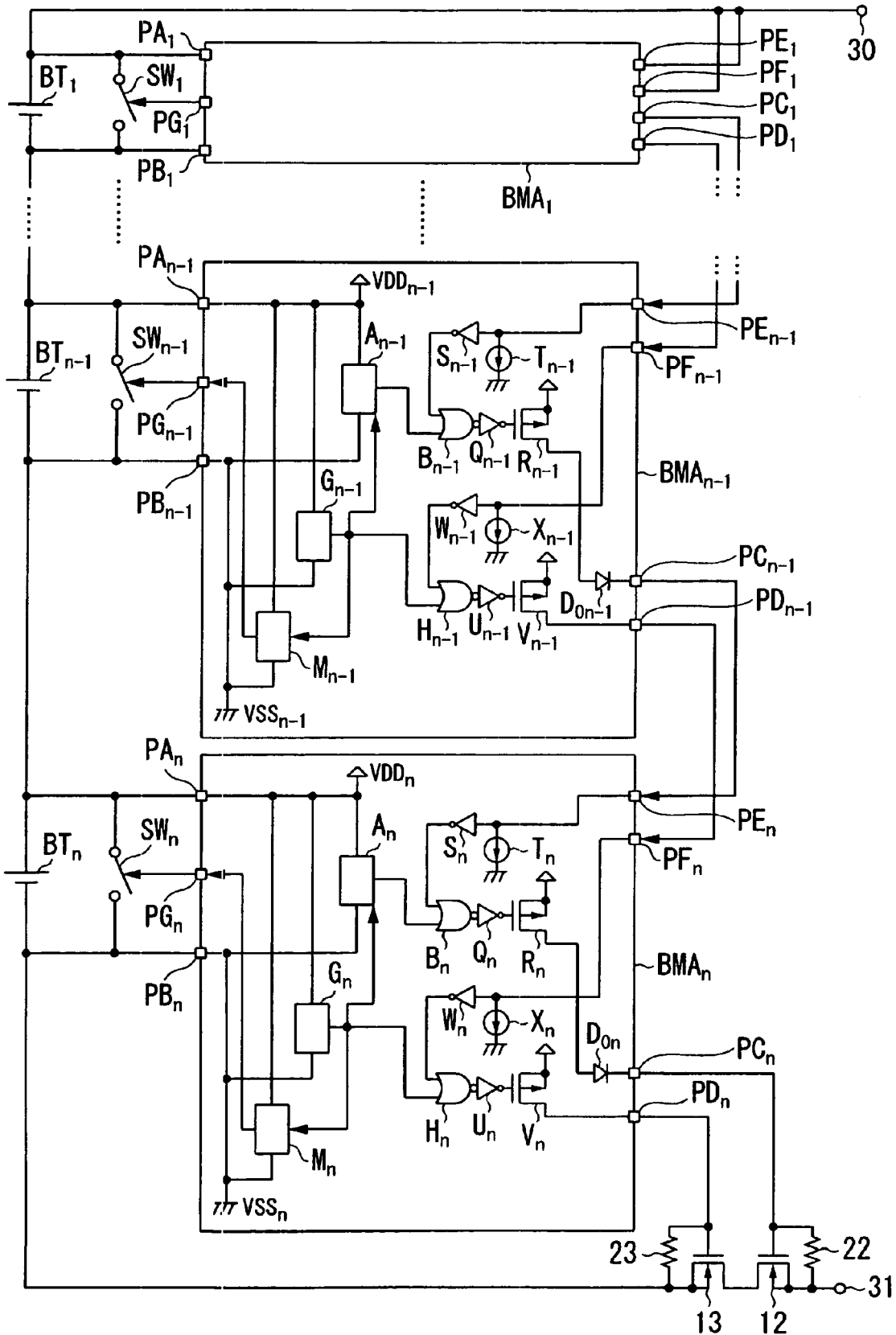
FIG. 3 is a circuit configuration diagram showing a battery device according to a second embodiment of the present invention.

FIG. 3 is a circuit configuration diagram showing the battery device according to the second embodiment. In FIG. 3, the same components as those of FIG. 1 are denoted by identical symbols, and their description will be omitted. In order to distinguish from FIG. 1, the symbols of the battery state monitoring circuits are $BMA_1$ to $BMA_n$, the symbol of the first transistor is 12, the symbol of the second transistor is 13, the symbol of the first resistive element is 22, and the symbol of the second resistive element is 23. Also, since the circuit configurations of those battery state monitoring circuits $BMA_1$ to $BMA_n$ are identical with each other, the most downstream side battery state monitoring circuit $BMA_n$ will be representatively described below.

The battery state monitoring circuit $BMA_n$ according to the second embodiment includes the overcharge detector circuit $A_n$, the first NOR circuit $B_n$, a first inverter $Q_n$, a first output transistor $R_n$, a diode $Do_n$, a second inverter $S_n$, a first current source $T_n$, an overdischarge detector circuit $G_n$, a second NOR circuit $H_n$, a third inverter $U_n$, a second output transistor $V_n$, a fourth inverter $W_n$, a second current source $X_n$, a cell balance circuit $M_n$, a first voltage monitor terminal $PA_n$, a second voltage monitor terminal $PB_n$, a first transmitting terminal PC, a second transmitting terminal $PD_n$, a first receiving terminal $PE_n$, a second receiving terminal $PF_n$, and a control terminal $PG_n$. The battery state monitoring circuit $BMA_n$ having the above components is configured as an IC of one chip.

To the first NOR circuit $B_n$, an overcharge detection signal that is output from the overcharge detector circuit $A_n$, and an output signal of the second inverter $S_n$ are input, and the first NOR circuit $B_n$ outputs a negative OR signal of those signals to the first inverter $Q_n$. The first inverter $Q_n$ outputs the logical inversion signal of the negative OR signal that is input from the first NOR circuit $B_n$ to a gate terminal of the first output transistor $R_n$. The first output transistor $R_n$ is a p-channel type MOS transistor. The first output transistor $R_n$ has the gate terminal connected to an output terminal of the first inverter $Q_n$, a drain terminal connected to an anode terminal of the diode $Do_n$, and a source terminal connected to the $VDD_n$. The diode $Do_n$ is a discharge leak current prevention diode, and has the anode terminal connected to the drain terminal of the first output transistor $R_n$, and a cathode terminal connected to the first transmitting terminal $PC_n$.

The second inverter $S_n$ has an input terminal connected to the first receiving terminal $PE_n$ and an input terminal of the first current source $T_n$, and outputs the logical inversion signal of the input signal to the input terminal to the first NOR circuit $B_n$. The first current source $T_n$ is a current source that has the input terminal connected to the first receiving terminal $PE_n$ and the input terminal of the second inverter $S_n$, and an output terminal connected to the $VSS_n$.

To the second NOR circuit $H_n$, an overdischarge detection signal that is output from the overdischarge detector circuit $G_n$ and the output signal of the fourth inverter $W_n$ are input, and the second NOR circuit $H_n$ outputs a negative OR signal of those signals to the third inverter $U_n$. The third inverter $U_n$ outputs the logical inversion signal of the negative OR signal that is input from the second NOR circuit $H_n$ to a gate terminal of the second output transistor $V_n$. The second output transistor $V_n$ is a p-channel type MOS transistor, and has the gate terminal connected to an output terminal of the third inverter $U_n$, a drain terminal connected to the second transmitting terminal $PD_n$, and a source terminal connected to the $VDD_n$.

The fourth inverter $W_n$ has an input terminal connected to the second receiving terminal $PF_n$ and an input terminal of the second current source $X_n$, and outputs the logical inversion signal of the input signal to the input terminal to the second NOR circuit $H_n$. The second current source $X_n$ is a current source that has the input terminal connected to the second receiving terminal $PF_n$ and the input terminal of the fourth inverter $W_n$, and an output terminal connected to the $VSS_n$.

The first transmitting terminal $PC_n$ is connected to a gate terminal of the first transistor 12 and one end of the first resistive element 22. The second transmitting terminal $PD_n$ is connected to a gate terminal of the second transistor 13 and one end of the second resistive element 23. The first receiving terminal $PE_n$ is connected to a first transmitting terminal $PC_{n-1}$ of the battery state monitoring circuit $BMA_{n-1}$. The second receiving terminal $PF_n$ is connected to a second transmitting terminal $PD_{n-1}$ of the battery state monitoring circuit $BMA_{n-1}$.

The same is applied to the other battery state monitoring circuits, and the first receiving terminal of the battery state monitoring circuit on the downstream side (battery $BT_n$ side) is connected to the first transmitting terminal of the battery state monitoring circuit on the upstream side (battery $BT_1$ side). The second receiving terminal of the battery state monitoring circuit on the downstream side is connected to the second transmitting terminal of the battery state monitoring circuit on the upstream side. The first receiving terminal $PE_1$ and the second receiving terminal $PF_1$ of the battery state monitoring circuit $BMA_1$ which is the most upstream side are connected to the positive terminal of the battery $BT_1$.

The first transistor 12 is an n-channel type MOS transistor. The first transistor 12 has the gate terminal connected to the first transmitting terminal $PC_n$ of the battery state monitoring circuit $BM_n$ and the one end of the first resistive element 22. The first transistor 12 also has a drain terminal connected to a drain terminal of the second transistor 13, and a source terminal connected to another terminal of the first resistive element 22 and the negative terminal of the battery $BT_n$. The second transistor 13 is an n-channel type MOS transistor. The second transistor 13 has the gate terminal connected to the second transmitting terminal $PD_n$ of the battery state monitoring circuit $BMA_n$ and the one end of the second resistive element 23. The second transistor 13 also has the drain terminal connected to the drain terminal of the second transistor 12, and a source terminal connected to another terminal of the second resistive element 23 and the second external terminal 31. On the other hand, the first external terminal 30 is connected to the positive terminal of the battery $BT_1$ on the most upstream side.

Subsequently, a description will be given of the operation of the battery device according to the second embodiment, which is configured as described above. The operation in the cell balance state is identical with that in the first embodiment, and therefore its description will be omitted.

(Normal State)

First, a description will be given of a normal state, that is, a case in which the voltages of all the batteries $BT_1$ to $BT_n$ are lower than the overcharge voltage, and equal to or higher than the overdischarge voltage. In the normal state thus defined, the overcharge detector circuit $A_n$ of the battery state monitoring circuit $BMA_n$ outputs the overcharge detection signal of low level to the first NOR circuit $B_n$.

In this situation, a first output transistor $R_{n-1}$ of the battery state monitoring circuit $BMA_{n-1}$ is on (the reason will be described later). As a result, the input terminal of the second inverter $S_n$ of the battery state monitoring circuit $BMA_n$ becomes at high level, and the output signal of low level is output from the second inverter $S_n$ to the first NOR circuit $B_n$. The first NOR circuit $B_n$ outputs the negative OR signal of high level to the first inverter $Q_n$, and the first inverter $Q_n$ outputs the logical inversion signal of low level to the gate terminal of the first output transistor $R_n$. As a result, because the first output transistor $R_n$ is turned on, the first transmitting terminal $PC_n$ becomes at high level, and the first transistor 12 is turned on.

Now, the reason why the first output transistor $R_{n-1}$ of the battery state monitoring circuit $BMA_{n-1}$ is on will be described below. Because the first receiving terminal $PE_1$ of the battery state monitoring circuit $BMA_1$ on the most upstream side is connected to the positive terminal of the battery $BT_1$, an input terminal of a second inverter $S_1$ is always held at high level. Accordingly, the second inverter $S_1$ always outputs the output signal of low level to the first NOR circuit $B_1$, and the overcharge detector circuit $A_1$ outputs the overcharge detection signal of low level to the first NOR circuit $B_1$. With the above arrangement, the first NOR circuit $B_1$ outputs the negative OR signal of high level to a first inverter $Q_1$, and the first inverter $Q_1$ outputs the logical inversion signal of low level to a gate terminal of a first output transistor $R_1$. As a result, the first output transistor $R_1$ of the battery state monitoring circuit $BMA_1$ is turned on.

In this situation, an input terminal of a second inverter $S_2$ in the battery state monitoring circuit $BMA_2$ that is the downstream side of the battery state monitoring circuit $BMA_1$ becomes at high level, and the output signal of low level is output from the second inverter $S_2$ to the first NOR circuit $B_2$. Since the overcharge detector circuit $A_2$ outputs the overcharge detection signal of low level, the first NOR circuit $B_2$ outputs the negative OR signal of high level to a first inverter $Q_2$, and the first inverter $Q_2$ outputs the logical inversion signal of low level to a gate terminal of a first output transistor $R_2$. As a result, the first output transistor $R_2$ is turned on.

The above operation is repeated in the upstream side battery state monitoring circuit and the downstream side battery state monitoring circuit, and the first output transistor $R_{n-1}$ of the battery state monitoring circuit $BMA_{n-1}$ is turned on.

Also, in the above normal state, the overdischarge detector circuit G of the battery state monitoring circuit $BM_n$ outputs the overdischarge detection signal of low level to the second NOR circuit $H_n$. In this situation, because a second output transistor $V_{n-1}$ of the battery state monitoring circuit $BM_{n-1}$ is also on, the input terminal of the fourth inverter $W_n$ in the battery state monitoring circuit $BMA_n$ becomes at high level, and the output signal of low level is output to the second NOR circuit $H_n$ from the fourth inverter $W_n$. The second NOR circuit $H_n$ outputs the negative OR signal of high level to the third inverter $U_n$, and the third inverter $U_n$ outputs the logical inversion signal of low level to the gate terminal of the second output transistor $V_n$. As a result, because the second output transistor $V_n$ is turned on, the second transmitting terminal $PD_n$ becomes at high level, and the second transistor 13 is turned on.

As described above, in the normal state, because the first transistor 12 and the second transistor 13 are turned on, the battery device is chargeable and dischargeable.

(Overcharged State)

Subsequently, a description will be given of an overcharged state, that is, a case in which a charger is connected between the first external terminal 30 and the second external terminal 31 to charge the batteries $BT_1$ to $BT_n$, and at least one voltage of those batteries $BT_1$ to $BT_n$ becomes equal to or higher than the overcharge voltage. In the following description, it is assumed that the voltage of the battery $BT_{n-1}$ is equal to or higher than the overcharge voltage.

In this case, the overcharge detector circuit $A_{n-1}$ of the battery state monitoring circuit $BMA_{n-1}$ outputs the overcharge detection signal of high level to the first NOR circuit $B_{n-1}$. In this situation, because the output signal of low level is output from a second inverter $S_{n-1}$, the first NOR circuit $B_{n-1}$ outputs the negative OR signal of low level to a first inverter $Q_{n-1}$, and the first inverter $Q_{n-1}$ outputs the logical inversion signal of high level to a gate terminal of the first output transistor $R_{n-1}$. As a result, the first output transistor $R_{n-1}$ is turned off.

That is, the input terminal of the second inverter $S_n$ is pulled down to low level by means of the first current source $T_n$, and the output signal of high level is output to the first NOR circuit $B_n$ from the second inverter $S_n$. On the other hand, because the overcharge detector circuit $A_n$ outputs the overcharge detection signal of low level to the first NOR circuit $B_n$, the first NOR circuit $B_n$ outputs the negative OR signal of low level to the first inverter $Q_n$, and the first inverter $Q_n$ outputs the logical inversion signal of high level to the gate terminal of the first output transistor $R_n$. As a result, the first output transistor $R_n$ is turned off.

As described above, when the first output transistor $R_n$ is turned off, the gate terminal of the first transistor 12 becomes at low level by means of the first resistive element 22, and the first transistor 12 is turned off. As a result, the charging from the charger is prohibited.

In the above description, it is assumed that the voltage of the battery $BT_{n-1}$ is equal to or higher than the overcharge voltage. The same is applied to a case in which the voltages of the other batteries are equal to or higher than the overcharge voltage. That is, a fact that the overcharged state occurs is communicated from the battery state monitoring circuit corresponding to the battery that has become in the overcharged state to the downstream side battery state monitoring circuit, and the communication reaches the most downstream side battery state monitoring circuit $BMA_n$. As a result, the first transistor 12 is turned off to prohibit the charging from the charger.

(Overdischarged State)

Subsequently, a description will be given of an overdischarged state, that is, a case in which a load is connected between the first external terminal 30 and the second external terminal 31 to discharge the batteries $BT_1$ to $BT_n$, and at least one voltage of those batteries $BT_1$ to $BT_n$ becomes lower than the overdischarge voltage. In the following description, it is assumed that the voltage of the battery $BT_{n-1}$ is lower than the overdischarge voltage.

In this case, an overdischarge detector circuit $G_{n-1}$ of the battery state monitoring circuit $BMA_{n-1}$ outputs the overdischarge detection signal of high level to a second NOR circuit $H_{n-1}$. In this situation, because the output signal of low level is output from a fourth inverter $W_{n-1}$, the second NOR circuit $H_{n-1}$ outputs the negative OR signal of low level to a third inverter $U_{n-1}$, and the third inverter $U_{n-1}$ outputs the logical inversion signal of high level to a gate terminal of the second output transistor $V_{n-1}$. As a result, the second output transistor $V_{n-1}$ is turned off.

That is, the input terminal of the fourth inverter $W_n$ is pulled down to low level by means of the second current source $X_n$, and the output signal of high level is output to the second NOR circuit $H_n$ from the fourth inverter $W_n$. On the other hand, because the overdischarge detector circuit $G_n$ outputs the overdischarge detection signal of low level to the second NOR circuit $H_n$, the second NOR circuit $H_n$ outputs the negative OR signal of low level to the third inverter $U_n$, and the third inverter $U_n$ outputs the logical inversion signal of high level to the gate terminal of the second output transistor $V_n$. As a result, the second output transistor $V_n$ is turned off.

As described above, when the second output transistor $V_n$ is turned off, the gate of the second transistor 13 becomes at low level by means of the second resistive element 23, and the second transistor 13 is turned off. As a result, the discharging to the load is prohibited.

In the above description, it is assumed that the voltage of the battery $BT_{n-1}$ is lower than the overdischarge voltage. The same is applied to a case in which the voltages of the other batteries are lower than the overdischarge voltage. That is, a fact that the overdischarged state occurs is communicated from the battery state monitoring circuit corresponding to the battery that has become in the overdischarged state to the downstream side battery state monitoring circuit, and the communication reaches the most downstream side battery state monitoring circuit $BMA_n$. As a result, the second transistor 13 is turned off to prohibit the discharging to the load.

Figure 4:
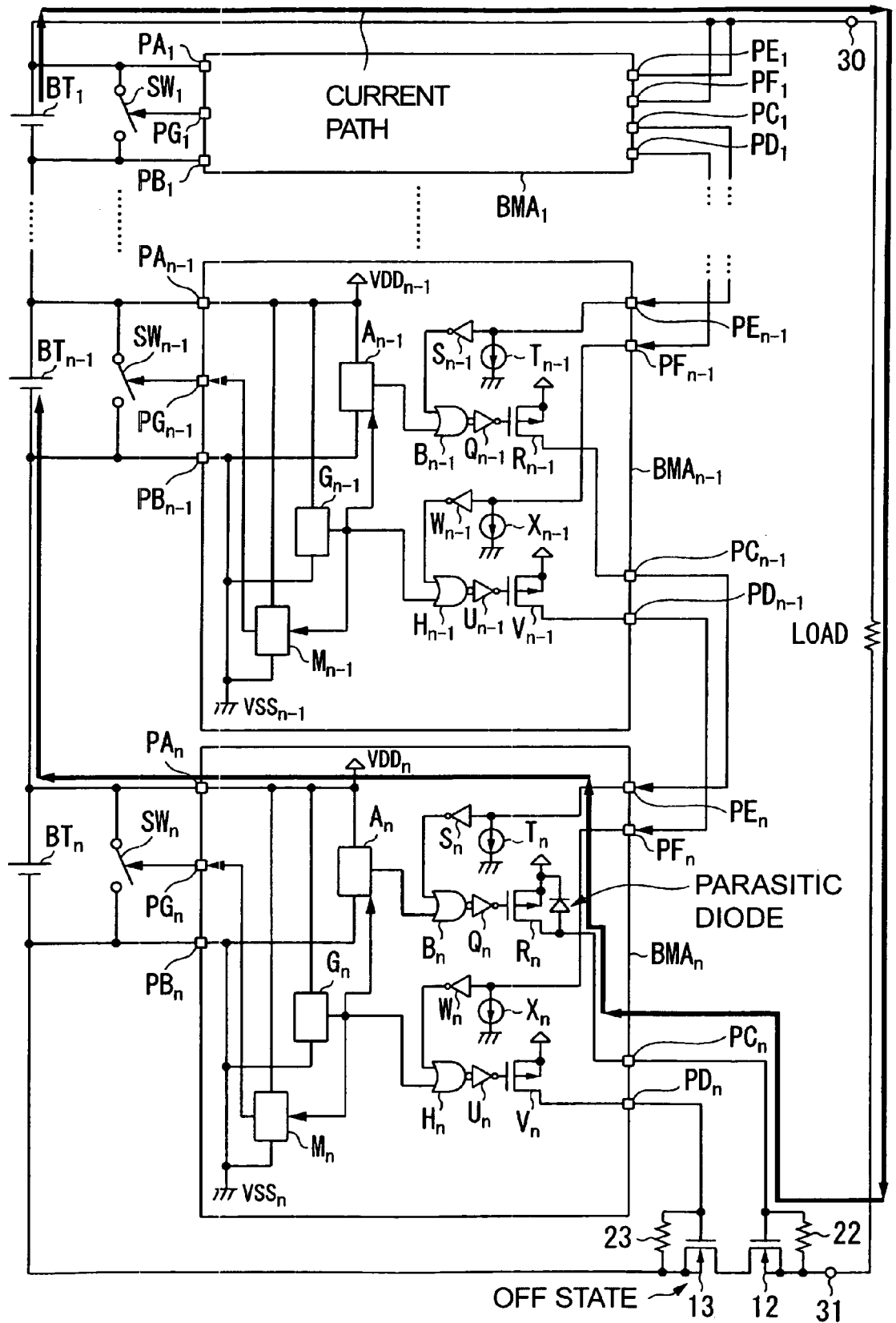
FIG. 4 is an explanatory diagram showing a discharge leak current preventing principle in the battery device according to the second embodiment of the present invention.

Hereinafter, a description will be given of the reason why the discharge leak current can be prevented with the provision of the diode $Do_n$ in the battery state monitoring circuit $BMA_n$ on the premise of the above operation. FIG. 4 shows the circuit configuration of the battery device in which no diode $Do_n$ is provided. For example, in FIG. 4, it is assumed that the battery $BT_n$ is overdischarged during the discharging to the load, and the second transistor 13 is turned off. In this case, the first output transistor $R_n$ of the battery state monitoring circuit $BMA_n$ becomes off. However, because a parasitic diode having a cathode terminal on the source side and an anode terminal on the drain side exists between the drain terminal and the gate terminal of the first output transistor $R_n$, a current path is formed as shown in FIG. 4. As a result, the electric discharge of the batteries $BT_1$ to $BT_{n-1}$ does not stop, thereby causing the discharge leak current to occur. On the other hand, according to the battery state monitoring circuit $BMA_n$ of the second embodiment, because the diode $Do_n$ of a direction opposite to the parasitic diode of the first output transistor $R_n$ is provided, it is possible to prevent the discharge leak current shown in FIG. 4 from occurring.

As described above, in the battery device according to the second embodiment, the occurrence of the discharge leak current can be prevented as in the first embodiment, and the disruption of the voltage balance between the batteries as in the conventional technology does not occur. As a result, it is possible to eliminate the load on the user, such as the costs and time required for battery exchange.

Third Embodiment

Figure 5:
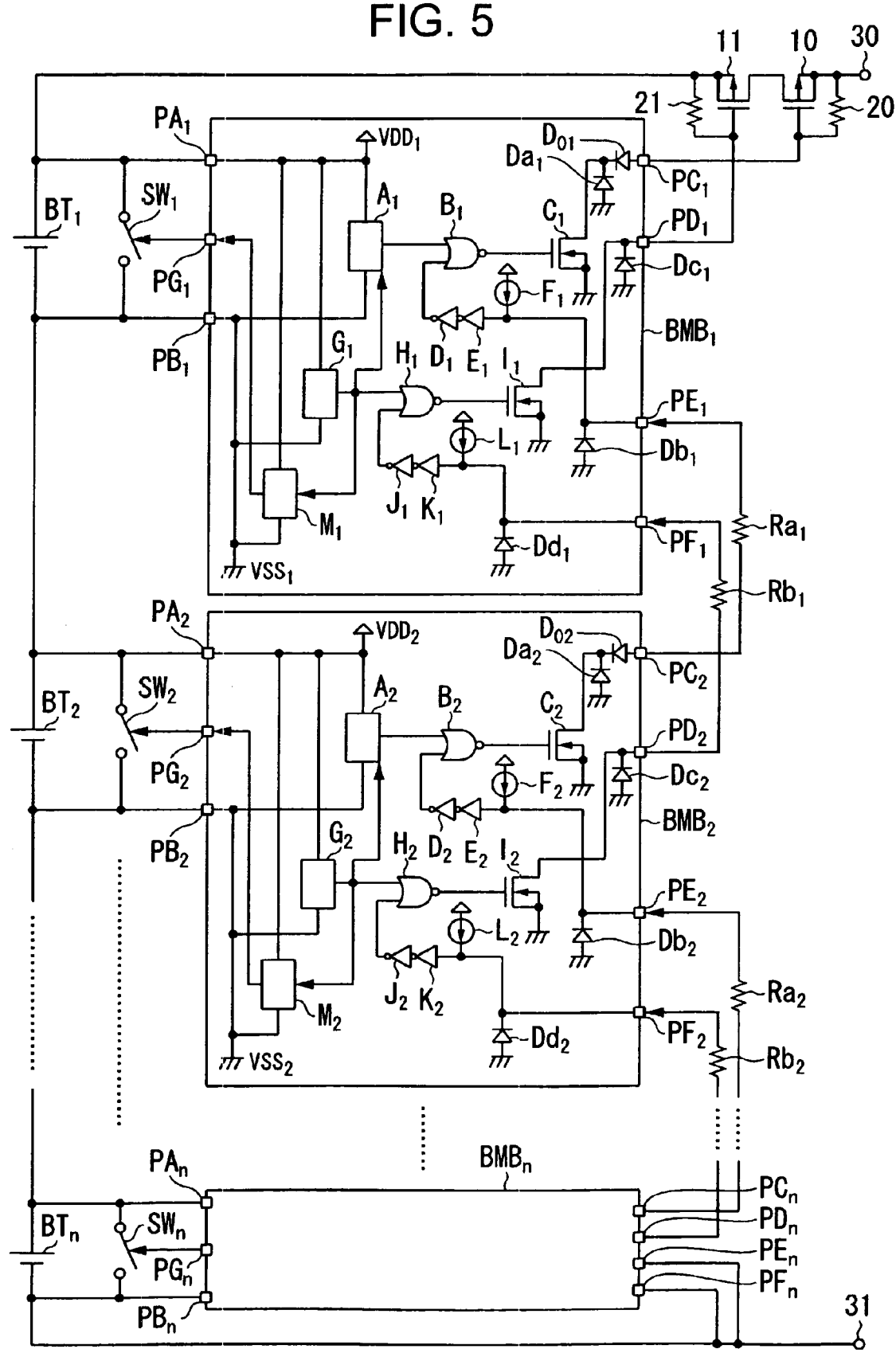
FIG. 5 is a circuit configuration diagram showing a battery device according to a third embodiment of the present invention.

Subsequently, a description will be given of a battery device according to a third embodiment. FIG. 5 is a circuit configuration diagram showing the battery device according to the third embodiment. As shown in the figure, in the third embodiment, two types of diodes are disposed in the battery state monitoring circuit of the first embodiment. That is, when it is assumed that the symbols of the battery state monitoring circuits are $BMB_1$ to $BMB_n$, the battery state monitoring circuit $BMB_1$ is newly equipped with a first diode (first clamp diode) $Da_1$, a second diode (second clamp diode) $Db_1$, a third diode (third clamp diode) $Dc_1$, and a fourth diode (fourth clamp diode) $Dd_1$ in addition to the components of the first embodiment. The same is applied to the other battery state monitoring circuits. In the following description, the battery state monitoring circuit $BMB_1$ will be representatively described.

The first diode $Da_1$ has an anode terminal connected to the $VSS_1$, and a cathode terminal connected to the drain terminal of the first output transistor $C_1$. The first diode $Da_1$ has such a characteristic as to generate a reverse current when a reverse voltage corresponding to a voltage (for example, 4.5V) that exceeds the withstand voltage of the battery state monitoring circuit is applied between the anode terminal and the cathode terminal. The second diode $Db_1$ has an anode terminal connected to the $VSS_1$, and a cathode terminal connected to the input terminal of the second inverter $E_1$. It is assumed that the voltage drop of the second diode $Db_1$ is 0.7 V.

The third diode $Dc_1$ has an anode terminal connected to the $VSS_1$, and a cathode terminal connected to the drain terminal of the second output transistor $I_1$. The third diode $Dc_1$ has such a characteristic as to generate a reverse current when a reverse voltage corresponding to a voltage that exceeds the withstand voltage of the battery state monitoring circuit is applied between the anode terminal and the cathode terminal. The fourth diode $Dd_1$ has an anode terminal connected to the $VSS_1$, and a cathode terminal connected to the input terminal of the fourth inverter $K_1$. It is assumed that the voltage drop of the fourth diode $Dd_1$ is 0.7 V.

Also, resistive elements are connected between the first transmitting terminal of the downstream side battery state monitoring circuit and the first receiving terminal of the upstream side battery state monitoring circuit, and between the second transmitting terminal of the downstream side battery state monitoring circuit and the second receiving terminal of the upstream side battery state monitoring circuit, respectively. Specifically, a resistive element $Ra_1$ is connected between the first transmitting terminal $PC_2$ of the battery state monitoring circuit $BMB_2$ and the first receiving terminal $PE_1$ of the battery state monitoring circuit $BMB_1$, and a resistive element $Rb_1$ is connected between the second transmitting terminal $PD_2$ of the battery state monitoring circuit $BMB_2$ and the second receiving terminal $PF_1$ of the battery state monitoring circuit $BMB_1$, respectively.

Subsequently, a description will be given of the operation of the battery device according to the third embodiment, which is configured as described above. The operation in the cell balance state is identical with that in the first embodiment, and therefore its description will be omitted.

(Normal State)

First, a description will be given of a normal state, that is, a case in which all the voltages of the batteries $BT_1$ to $BT_n$ are lower than the overcharge voltage, and equal to or higher than the overdischarge voltage. In the normal state thus defined, the overcharge detector circuit $A_1$ of the battery state monitoring circuit $BMB_1$ outputs the overcharge detection signal of low level to the first NOR circuit $B_1$.

In this situation, the first output transistor $C_2$ of the battery state monitoring circuit $BMB_2$ is on. As a result, the input terminal of the second inverter $E_1$ of the battery state monitoring circuit $BMB_1$ becomes at low level, and the output signal of low level is output from the first inverter $D_1$ to the first NOR circuit $B_1$. The first NOR circuit $B_1$ outputs the negative OR signal of high level to the gate terminal of the first output transistor $C_1$. As a result, because the first output transistor $C_1$ is turned on, the first transmitting terminal $PC_1$ becomes at low level, and the first transistor 10 is turned on.

In this situation, when the first output transistor $C_2$ of the battery state monitoring circuit $BMB_2$ is on, the first receiving terminal $PE_1$ of the battery state monitoring circuit $BMB_1$ is connected to the $VSS_2$ through the resistive element $Ra_1$. However, since the first receiving terminal $PE_1$ is equipped with the second diode $Db_1$, the voltage is clamped to $VSS_1$−0.7 V, and does not decrease lower than that value.

Also, in the above normal state, the overdischarge detector circuit $G_1$ of the battery state monitoring circuit $BMB_1$ outputs the overdischarge detection signal of low level to the second NOR circuit $H_1$. In this situation, the second output transistor $I_2$ of the battery state monitoring circuit $BMB_2$ is also on. Therefore, the input terminal of the fourth inverter $K_1$ in the battery state monitoring circuit $BMB_1$ becomes at low level, and the output signal of low level is output to the second NOR circuit $H_1$ from the third inverter $J_1$. The second NOR circuit $H_1$ outputs the negative OR signal of high level to the gate terminal of the second output transistor $I_1$. As a result, because the second output transistor $I_1$ is turned on, the second transmitting terminal $PD_1$ becomes at low level, and the second transistor 11 is turned on.

Similarly, the voltage of the second receiving terminal $PF_1$ of the battery state monitoring circuit $BMB_1$ is clamped to $VSS_1$−0.7 V.

As described above, in the normal state, because the first transistor 10 and the second transistor 11 are turned on, the battery device is chargeable and dischargeable.

(Overcharged State)

Subsequently, a description will be given of an overcharged state, that is, a case in which a charger is connected between the first external terminal 30 and the second external terminal 31 to charge the batteries $BT_1$ to $BT_n$, and at least one voltage of those batteries $BT_1$ to $BT_n$ becomes equal to or higher than the overcharge voltage. In the following description, it is assumed that the voltage of the battery $BT_2$ is equal to or higher than the overcharge voltage.

In this case, the overcharge detector circuit $A_2$ of the battery state monitoring circuit $BMB_2$ outputs the overcharge detection signal of high level to the first NOR circuit $B_2$. In this situation, because the output signal of low level is output from the first inverter $D_2$, the first NOR circuit $B_2$ outputs the negative OR signal of low level to the gate terminal of the first output transistor $C_2$. As a result, the first output transistor $C_2$ is turned off.

That is, the input terminal of the second inverter $E_1$ is pulled up to high level by means of the first current source $F_1$. As a result, a voltage recognized as high level is applied to the input terminal of the second inverter $E_1$, and the output signal of high level is output to the first NOR circuit $B_1$ from the first inverter $D_1$. On the other hand, because the overcharge detector circuit $A_1$ outputs the overcharge detection signal of low level to the first NOR circuit $B_1$, the first NOR circuit $B_1$ outputs the negative OR signal of low level to the gate terminal of the first output transistor $C_1$. As a result, the first output transistor $C_1$ is turned off.

In this situation, the first transmitting terminal $PC_2$ of the battery state monitoring circuit $BMB_2$ is pulled up to $VDD_1$ through the resistive element $Ra_1$. However, since the first transmitting terminal $PC_2$ is equipped with a first diode $Da_2$, the terminal voltage is clamped to $VSS_2$+4.5 V by a voltage (4.5 V) that causes the reverse current of the first diode $Da_2$ to be generated. Also, the resistance of the resistive element $Ra_1$ is set to a value that allows the voltage of the input terminal of the second inverter $E_1$ to be pulled up to high level by the first current source $F_1$.

As described above, when the first output transistor $C_1$ is turned off, the gate terminal of the first transistor 10 becomes at high level by means of the first resistive element 20, and the first transistor 10 is turned off. As a result, the charging from the charger is prohibited.

(Overdischarged State)

Subsequently, a description will be given of an overdischarged state, that is, a case in which a load is connected between the first external terminal 30 and the second external terminal 31 to discharge the batteries $BT_1$ to $BT_n$, and at least one voltage of those batteries $BT_1$ to $BT_n$ becomes lower than the overdischarge voltage. In the following description, it is assumed that the voltage of the battery $BT_2$ is lower than the overdischarge voltage.

In this case, the overdischarge detector circuit $G_2$ of the battery state monitoring circuit $BMB_2$ outputs the overdischarge detection signal of high level to the second NOR circuit $H_2$. In this situation, because the output signal of low level is output from the third inverter $J_2$, the second NOR circuit $H_2$ outputs the negative OR signal of low level to the gate terminal of the second output transistor $I_2$. As a result, the second output transistor $I_2$ is turned off.

That is, the input terminal of the fourth inverter $K_1$ is pulled up to high level by means of the second current source $L_1$. As a result, a voltage is recognized as high level is applied to the input terminal of the fourth inverter $K_1$, and the output signal of high level is output to the second NOR circuit $H_1$ from the third inverter $J_1$. On the other hand, because the overdischarge detector circuit $G_1$ outputs the overdischarge detection signal of low level to the second NOR circuit $H_1$, the second NOR circuit $H_1$ outputs the negative OR signal of low level to the gate terminal of the second output transistor $I_1$. As a result, the second output transistor $I_1$ is turned off.

In this situation, the second transmitting terminal $PD_2$ of the battery state monitoring circuit $BMB_2$ is pulled up to $VDD_1$ through the resistive element $Rb_1$. However, since the second transmitting terminal $PD_2$ is equipped with a third diode $Dc_2$, the terminal voltage is clamped to $VSS_2+4.5$ V by a voltage (4.5 V) that causes the reverse current of the third diode $Dc_2$ to be generated. Also, the resistance of the resistive element $Rb_1$ is set to a value that allows the voltage of the input terminal of the fourth inverter $K_1$ to be pulled up to high level by the second current source $L_1$.

As described above, when the second output transistor $I_1$ is turned off, the gate terminal of the second transistor 11 becomes at high level, and the second transistor 11 is turned off. As a result, the discharging to the load is prohibited.

In the first embodiment, in the battery state monitoring circuit that has detected the overcharged state or the overdischarged state, the first output transistor or the second output transistor are turned off, and a voltage for two cells (two batteries) is applied to the downstream side first output transistor or second output transistor which has been turned off by the pull-up operation in the upstream side battery state monitoring circuit. That is, the withstand voltage of one battery state monitoring circuit needs to be equal to or higher than the voltage for at least two cells. In contrast, in the third embodiment, in the battery state monitoring circuit that has detected the overcharged state or the overdischarged state, the first output transistor or the second output transistor are turned off, and a voltage for one cell (one battery) is applied to the downstream side first output transistor or second output transistor which has been turned off by the pull-up operation in the upstream side battery state monitoring circuit. That is, the withstand voltage of one battery state monitoring circuit needs to be equal to or higher than the voltage for at least one cell. As a result, according to the third embodiment, the battery state monitoring circuit that is lower in withstand voltage than that of the first embodiment can be fabricated, and a range of the available manufacturing process is further broadened. As in the first embodiment, the occurrence of the discharge leak current can be prevented, and the disruption of the voltage balance between the batteries as in the conventional technology does not occur. As a result, it is possible to eliminate the load on the user such as the costs and time required for battery exchange.

Fourth Embodiment

Figure 6:
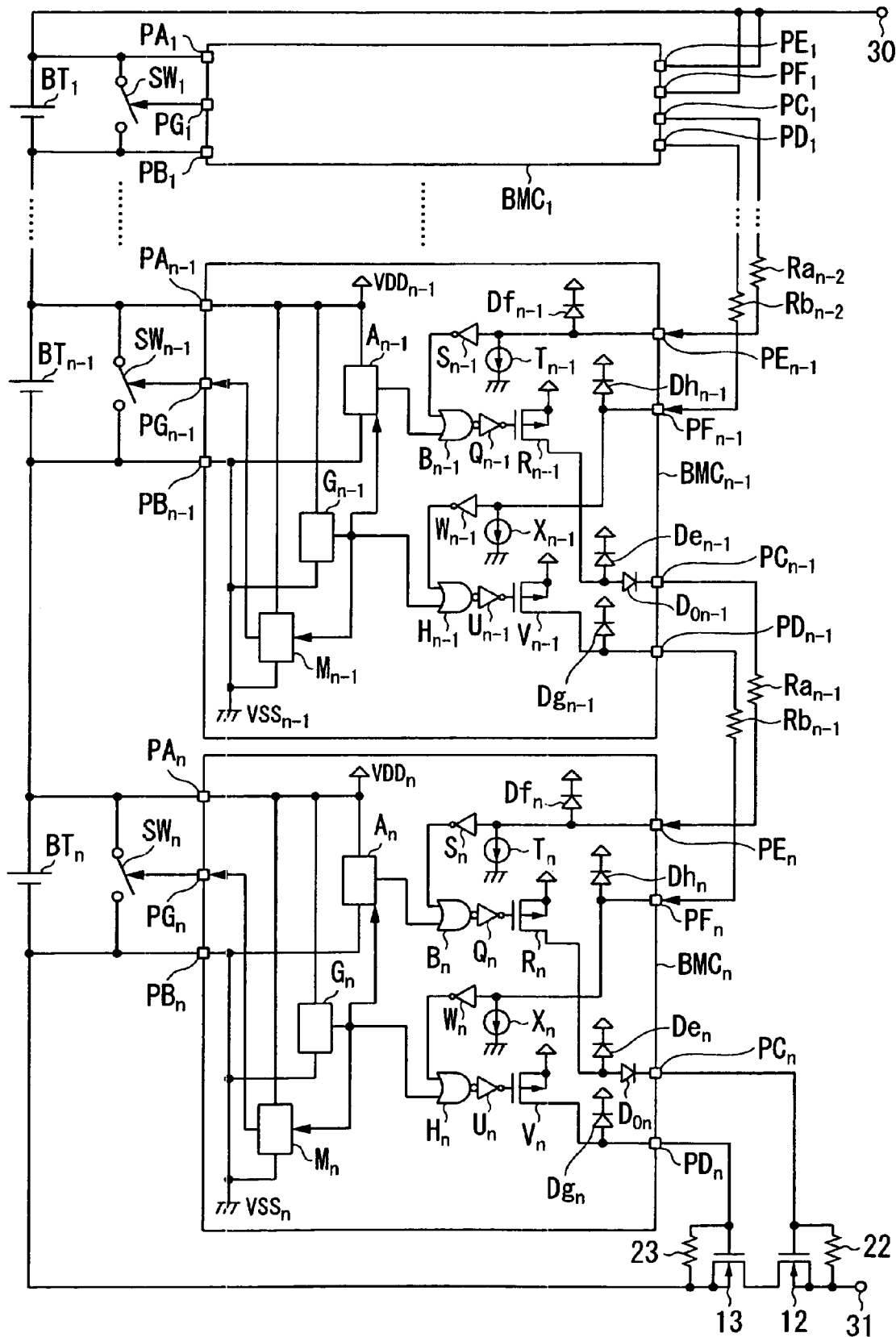
FIG. 6 is a circuit configuration diagram showing a battery device according to a fourth embodiment of the present invention.

Subsequently, a description will be given of a battery device according to a fourth embodiment. FIG. 6 is a circuit configuration diagram showing the battery device according to the fourth embodiment. As shown in the figure, in the fourth embodiment, two types of diodes are disposed in the battery state monitoring circuit of the second embodiment. That is, when it is assumed that the symbols of the battery state monitoring circuits are $BMC_1$ to $BMC_n$, the battery state monitoring circuit $BMC_n$ is newly equipped with a first diode $De_n$, a second diode $Df_n$, a third diode $Dg_n$, and a fourth diode $Dh_n$ in addition to the components of the second embodiment. The same is applied to the other battery state monitoring circuits. In the following description, the battery state monitoring circuit $BMC_n$ will be representatively described.

The first diode $De_n$ has an anode terminal connected to the drain terminal of the first output transistor $R_n$, and a cathode terminal connected to the $VDD_n$. The first diode $De_n$ has such a characteristic as to generate a reverse current when a reverse voltage corresponding to a voltage (for example, 4.5 V) that exceeds the withstand voltage of the battery state monitoring circuit is applied between the anode terminal and the cathode terminal. The second diode $Df_n$ has an anode terminal connected to the input terminal of the second inverter $S_n$, and a cathode terminal connected to the $VDD_n$. It is assumed that the voltage drop of the second diode $Df_n$ is 0.7 V.

The third diode $Dg_n$ has an anode terminal connected to the drain terminal of the second output transistor $V_n$, and a cathode terminal connected to the $VDD_n$. The third diode $Dg_n$ has such a characteristic as to generate a reverse current when a reverse voltage corresponding to a voltage (for example, 4.5 V) that exceeds the withstand voltage of the battery state monitoring circuit is applied between the anode terminal and the cathode terminal. The fourth diode $Dh_n$ has an anode terminal connected to the input terminal of the fourth inverter $W_n$, and a cathode terminal connected to the $VDD_n$. It is assumed that the voltage drop of the fourth diode $Dh_n$ is 0.7 V.

Also, resistive elements are connected between the first transmitting terminal of the upstream side battery state monitoring circuit and the first receiving terminal of the downstream side battery state monitoring circuit, and between the second transmitting terminal of the upstream side battery state monitoring circuit and the second receiving terminal of the downstream side battery state monitoring circuit, respectively. Specifically, a resistive element $Ra_{n-1}$ is connected between the first transmitting terminal $PC_{n-1}$ of the battery state monitoring circuit $BMC_{n-1}$ and the first receiving terminal $PE_n$ of the battery state monitoring circuit $BMC_n$, and a resistive element $Rb_{n-1}$ is connected between the second transmitting terminal $PD_{n-1}$ of the battery state monitoring circuit $BMC_{n-1}$ and the second receiving terminal $PF_{n-1}$ of the battery state monitoring circuit $BMC_n$, respectively.

Subsequently, a description will be given of the operation of the battery device according to the fourth embodiment, which is configured as described above. The operation in the cell balance state is identical with that in the first embodiment, and therefore its description will be omitted.

(Normal State)

First, a description will be given of a normal state, that is, a case in which all the voltages of the batteries $BT_1$ to $BT_n$ are lower than the overcharge voltage, and equal to or higher than the overdischarge voltage. In the normal state thus defined, the overcharge detector circuit $A_n$ of the battery state monitoring circuit $BMC_n$ outputs the overcharge detection signal of low level to the first NOR circuit $B_n$.

In this situation, the first output transistor $R_{n-1}$ of the battery state monitoring circuit $BMC_{n-1}$ is on. As a result, the input terminal of the second inverter $S_n$ of the battery state monitoring circuit $BMC_n$ becomes at high level, and the output signal of low level is output from the second inverter $S_n$ to the first NOR circuit $B_n$. The first NOR circuit $B_n$ outputs the negative OR signal of high level to the first inverter $Q_n$, and the first inverter $Q_n$ outputs the logical inversion signal of low level to the gate terminal of the first output transistor $R_n$. As a result, because the first output transistor $R_n$ is turned on, the first transmitting terminal $PC_n$ becomes at high level, and the first transistor 12 is turned on.

Also, in the above normal state, the overdischarge detector circuit $G_n$ of the battery state monitoring circuit $BMC_n$ outputs the overdischarge detection signal of low level to the second NOR circuit $H_n$. In this situation, the second output transistor $V_{n-1}$ of the battery state monitoring circuit $BMC_{n-1}$ is on. Therefore, the input terminal of the fourth inverter $W_n$ in the battery state monitoring circuit $BMC_n$ becomes at high level, and the output signal of low level is output to the second NOR circuit $H_n$ from the fourth inverter $W_n$. The second NOR circuit $H_n$ outputs the negative OR signal of high level to the third inverter $U_n$, and the third inverter $U_n$ outputs the logical inversion signal of low level to the gate terminal of the second output transistor $V_n$. As a result, because the second output transistor $V_n$ is turned on, the second transmitting terminal $PD_n$ becomes at high level, and the second transistor 13 is turned on.

As described above, in the normal state, because the first transistor 12 and the second transistor 13 are turned on, the battery device is chargeable and dischargeable.

(Overcharged State)

Subsequently, a description will be given of an overcharged state, that is, a case in which a charger is connected between the first external terminal 30 and the second external terminal 31 to charge the batteries $BT_1$ to $BT_n$, and at least one voltage of those batteries $BT_1$ to $BT_n$ becomes equal to or higher than the overcharge voltage. In the following description, it is assumed that the voltage of the battery $BT_{n-1}$ is equal to or higher than the overcharge voltage.

In this case, the overcharge detector circuit $A_{n-1}$ of the battery state monitoring circuit $BMC_{n-1}$ outputs the overcharge detection signal of high level to the first NOR circuit $B_{n-1}$. In this situation, because the output signal of low level is output from the second inverter $S_{n-1}$, the first NOR circuit $B_{n-1}$ outputs the negative OR signal of low level to the first inverter $Q_{n-1}$, and the first inverter $Q_{n-1}$ outputs the logical inversion signal of high level to the gate terminal of the first output transistor $R_{n-1}$. As a result, the first output transistor $R_{n-1}$ is turned off.

That is, the input terminal of the second inverter $S_n$ is pulled down to low level by means of the first current source $T_n$. When the pull-down voltage becomes equal to or lower than $VDD_n-4.5$ V, a current flows in the $VSS_n$ through a first diode $De_{n-1}$ of the battery state monitoring circuit $BMC_{n-1}$. That is, the input terminal of the second inverter $S_n$ is clamped to $VDD_n-4.5$ V, and in that condition, the voltage does not satisfy the operating voltage (voltage that is recognized as low level) of the second inverter $S_n$. Therefore, the resistance of the resistive element $Ra_{n-1}$ is set so that the voltage of the input terminal of the second inverter $S_n$ reaches the operating voltage.

With the above arrangement, a voltage recognized as low level is applied to the input terminal of the second inverter $S_n$, and the output signal of high level is output to the first NOR circuit $B_n$ from the second inverter $S_n$. On the other hand, because the overcharge detector circuit $A_n$ outputs the overcharge detection signal of low level to the first NOR circuit $B_n$, the first NOR circuit $B_n$ outputs the negative OR signal of low level to the first inverter $Q_n$, and the first inverter $Q_n$ outputs the logical inversion signal of high level to the gate terminal of the first output transistor $R_n$. As a result, the first output transistor $R_n$ is turned off.

As described above, when the first output transistor $R_n$ is turned off, the gate terminal of the first transistor 12 becomes at low level, and the first transistor 12 is turned off. As a result, the charging from the charger is prohibited.

(Overdischarged State)

Subsequently, a description will be given of an overdischarged state, that is, a case in which a load is connected between the first external terminal 30 and the second external terminal 31 to discharge the batteries $BT_1$ to $BT_n$, and at least one voltage of those batteries $BT_1$ to $BT_n$ becomes lower than the overdischarge voltage. In the following description, it is assumed that the voltage of the battery $BT_{n-1}$ is lower than the overdischarge voltage.

In this case, the overdischarge detector circuit $G_{n-1}$ of the battery state monitoring circuit $BMC_{n-1}$ outputs the overdischarge detection signal of high level to the second NOR circuit $H_{n-1}$. In this situation, because the output signal of low level is output from the fourth inverter $W_{n-1}$, the second NOR circuit $H_{n-1}$ outputs the negative OR signal of low level to the third inverter $U_{n-1}$, and the third inverter $U_{n-1}$ outputs the logical inversion signal of high level to the gate terminal of the second output transistor $V_{n-1}$. As a result, the second output transistor $V_{n-1}$ is turned off.

That is, the input terminal of the fourth inverter $W_n$ is pulled down to low level by means of the second current source $X_n$. When the pull-down voltage becomes equal to or lower than $VDD_n-4.5$ V, a current flows in the $VSS_n$ through a third diode $Dg_{n-1}$ of the battery state monitoring circuit $BMC_{n-1}$. That is, the input terminal of the fourth inverter $W_n$ is clamped to $VDD_n-4.5$ V, and in that condition, the voltage does not satisfy the operating voltage (voltage that is recognized as low level) of the fourth inverter $W_n$. Therefore, the resistance of the resistive element $Rb_{n-1}$ is set so that the voltage of the input terminal of the fourth inverter $W_n$ reaches the operating voltage.

With the above arrangement, a voltage recognized as low level is applied to the input terminal of the fourth inverter $W_n$, and the output signal of high level is output to the second NOR circuit $H_n$ from the fourth inverter $W_n$. On the other hand, because the overdischarge detector circuit $G_n$ outputs the overdischarge detection signal of low level to the second NOR circuit $H_n$, the second NOR circuit $H_n$ outputs the negative OR signal of low level to the third inverter $U_n$, and the third inverter $U_n$ outputs the logical inversion signal of high level to the gate terminal of the second output transistor $V_n$. As a result, the second output transistor $V_n$ is turned off.

As described above, when the second output transistor $V_n$ is turned off, the gate terminal of the second transistor 13 becomes at low level, and the second transistor 13 is turned off. As a result, the discharging to the load is prohibited.

As described above, according to the fourth embodiment, the withstand voltage of one battery state monitoring circuit needs to be equal to or higher than the voltage for at least one cell as in the third embodiment. As a result, according to the fourth embodiment, the battery state monitoring circuit that is further lower in withstand voltage than that of the second embodiment can be fabricated, and a range of the available manufacturing process is further broadened. As in the second embodiment, the occurrence of the discharge leak current can be prevented, and the disruption of the voltage balance between the batteries as in the conventional technology does not occur. As a result, it is possible to eliminate the load on the user such as the costs and time required for battery exchange.

Fifth Embodiment

Figure 7:
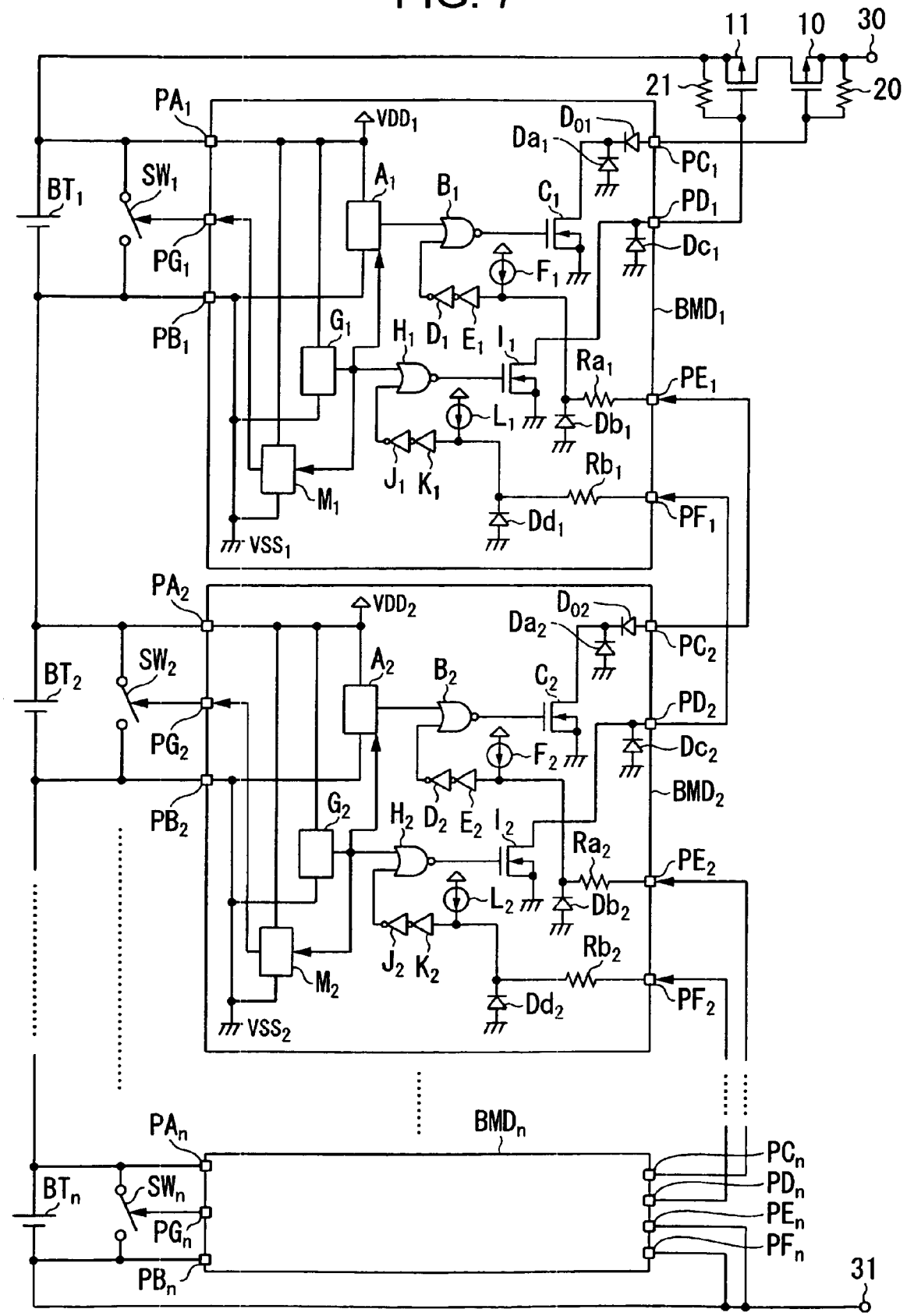
FIG. 7 is a circuit configuration diagram showing a battery device according to a fifth embodiment of the present invention.

Subsequently, a description will be given of a battery device according to a fifth embodiment. FIG. 7 is a circuit configuration diagram showing the battery device according to the fifth embodiment. As shown in the figure, in the fifth embodiment, the resistive elements that are disposed in the exterior of the battery state monitoring circuit in the third embodiment are disposed in the interior of the battery state monitoring circuit.

A battery state monitoring circuit $BMD_1$ will be representatively described. The resistive element $Ra_1$ is connected between the first receiving terminal $PE_1$ and the cathode terminal of the second diode $Db_1$ in the battery state monitoring circuit $BMD_1$. Also, the resistive element $Rb_1$ is connected between the second receiving terminal $PF_1$ and the cathode terminal of the fourth diode $Dd_1$.

The operation is identical with that in the third embodiment, and therefore its description will be omitted.

With the above configuration, a manufacturer of the battery device may merely prepare the battery state monitoring circuits $BMD_1$ of the same number as the number of batteries, and connect the upstream side and downstream side battery state monitoring circuits through no resistive element, thereby contributing to a reduction in manufacturing process. The provision of the resistive elements in the interior of the battery state monitoring circuit causes an increase in sizes of the battery state monitoring circuit and an increase in costs. In order to prevent this drawback, there can be applied the third embodiment.

Sixth Embodiment

Figure 8:
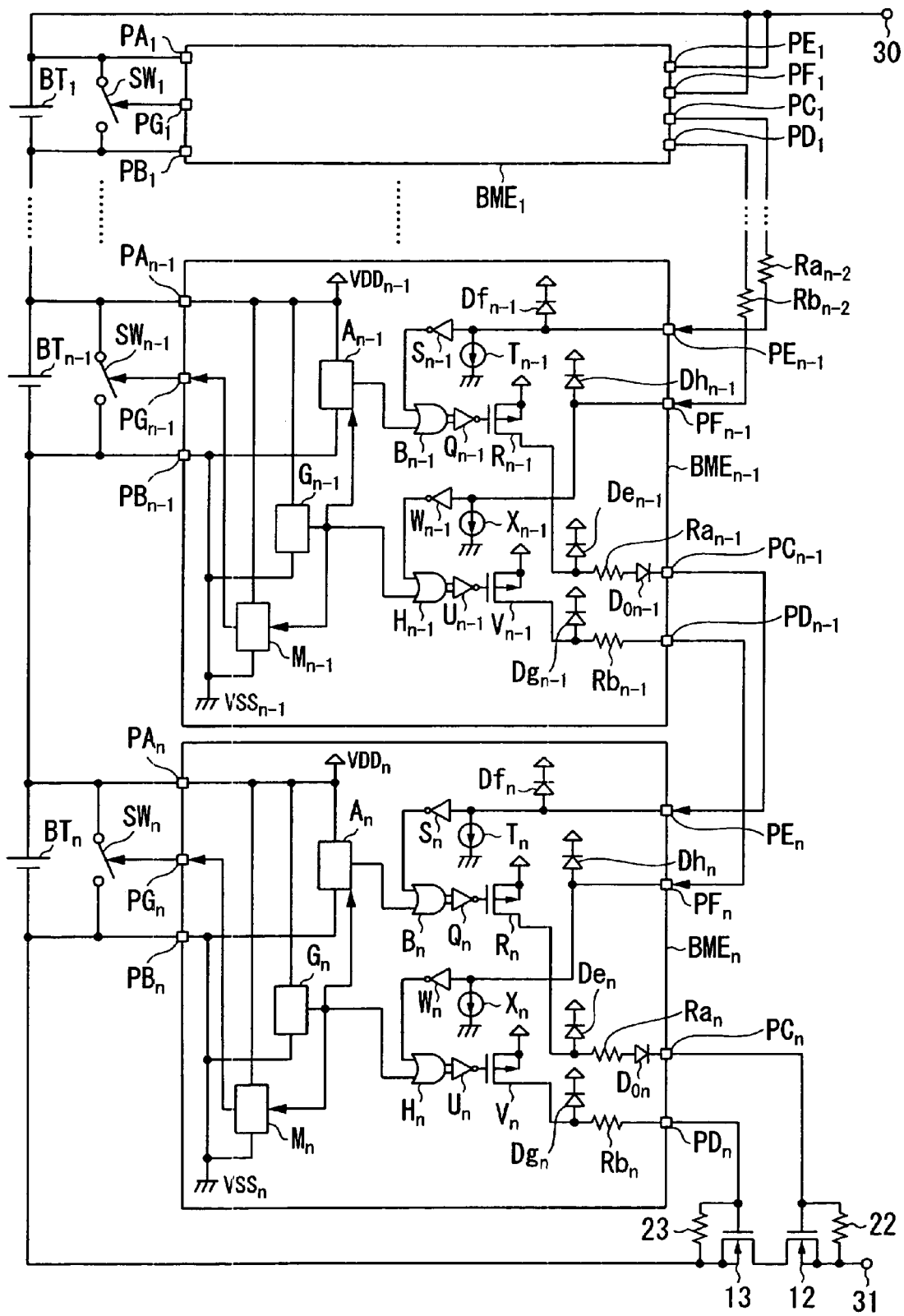
FIG. 8 is a circuit configuration diagram showing a battery device according to a sixth embodiment of the present invention.

Subsequently, a description will be given of a battery device according to a sixth embodiment. FIG. 8 is a circuit configuration diagram showing the battery device according to the sixth embodiment. As shown in the figure, in the sixth embodiment, the resistive elements that are disposed in the exterior of the battery state monitoring circuit in the fourth embodiment are disposed in the interior of the battery state monitoring circuit.

A battery state monitoring circuit $BME_n$ will be representatively described. A resistive element $Ra_n$ is connected between the anode terminal of the diode $Do_n$ and the anode terminal of the first diode $De_n$ in the battery state monitoring circuit $BME_n$. Also, a resistive element $Rb_n$ is connected between the anode terminal of the third diode $Dg_n$ and the second transmitting terminal $PD_n$.

The operation is identical with that in the fourth embodiment, and therefore its description will be omitted.

With the above configuration, a manufacturer of the battery device may merely prepare the battery state monitoring circuits $BME_n$ of the same number as the number of batteries, and connect the upstream side and downstream side battery state monitoring circuits through no resistive element, thereby contributing to a reduction in manufacturing process. The provision of the resistive elements in the interior of the battery state monitoring circuit causes an increase in sizes of the battery state monitoring circuit and an increase in costs. In order to prevent this drawback, there can be applied the fourth embodiment.

Alternatively, the resistive element $Ra_n$ may be connected between the input terminal of the second inverter $S_n$ and the first receiving terminal $PE_n$, and the resistive element $Rb_n$ may be connected between the input terminal of the fourth inverter $W_n$ and the second receiving terminal $PF_n$. Also, the resistive element $Ra_n$ may be connected between the anode terminal of the second diode $Df_n$ and the first receiving terminal $PE_n$, and the resistive element $Rb_n$ may be connected between the cathode terminal of the fourth diode $Dh_n$ and the second receiving terminal $PF_n$.

Seventh Embodiment

Figure 9:
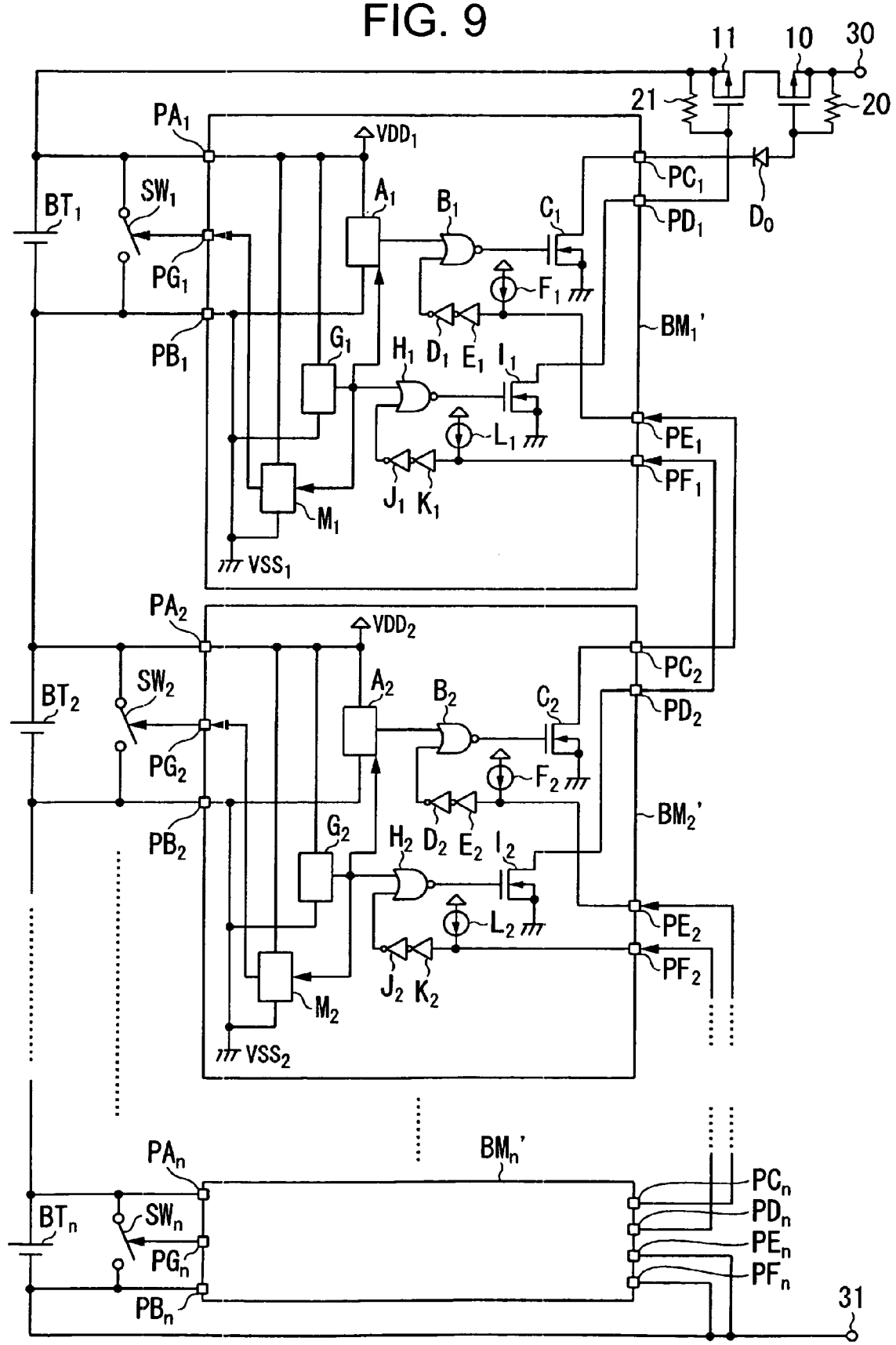
FIG. 9 is a circuit configuration diagram showing a battery device according to a seventh embodiment of the present invention.

Subsequently, a description will be given of a battery device according to a seventh embodiment. FIG. 9 is a circuit configuration diagram showing the battery device according to the seventh embodiment. As shown in the figure, the seventh embodiment is directed to the battery device in which the discharge leak current prevention diodes $Do_1$ to $Do_n$ are not disposed in the respective battery state monitoring circuits $BM_1$ to $BM_n$ of the first embodiment. In order to distinguish from the first embodiment, the symbols of the battery state monitoring circuits in the seventh embodiment are denoted by $BM_1'$ to $BM_n'$. In the seventh embodiment, a discharge leak current prevention diode Do is disposed in the exterior of the battery state monitoring circuits $BM_1'$ to $BM_n'$. Specifically, an anode terminal of the diode Do is connected to the gate terminal of the first transistor 10, and a cathode terminal of the diode Do is connected to the first transmitting terminal $PC_1$ of the battery state monitoring circuit $BM_1$.

With the battery device configured as described above, as in the first embodiment, the occurrence of the discharge leak current can be prevented, and the disruption of the voltage balance between the batteries as in the conventional technology does not occur. As a result, it is possible to eliminate the load on the user such as the costs and time required for battery exchange. Also, because it is unnecessary to provide the discharge leak current prevention diode within the battery state monitoring circuit, it is possible to reduce the costs and downsize the circuit.

Eighth Embodiment

Figure 10:
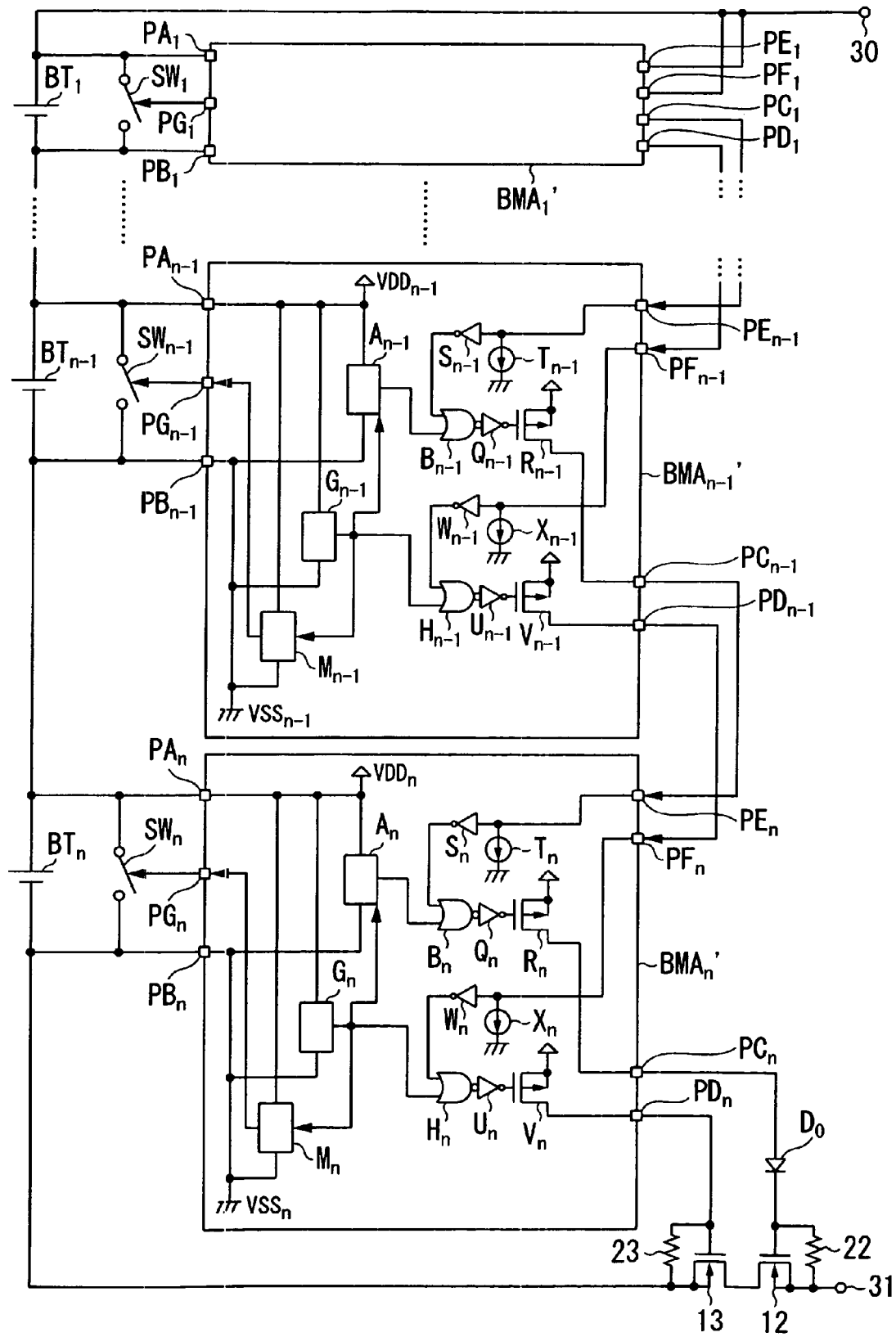
FIG. 10 is a circuit configuration diagram showing a battery device according to an eighth embodiment of the present invention.

Subsequently, a description will be given of a battery device according to an eighth embodiment. FIG. 10 is a circuit configuration diagram showing the battery device according to the eighth embodiment. As shown in the figure, the eighth embodiment is directed to the battery device in which the discharge leak current prevention diodes $Do_1$ to $Do_n$ are not disposed in the respective battery state monitoring circuits $BMA_1$ to $BMA_n$ of the second embodiment. In order to distinguish from the second embodiment, the symbols of the battery state monitoring circuits in the eighth embodiment are denoted by $BMA_1'$ to $BMA_n'$. In the eighth embodiment, the discharge leak current prevention diode Do is disposed in the exterior of the battery state monitoring circuits $BMA_1'$ to $BMA_n'$. Specifically, the cathode terminal of the diode Do is connected to the gate terminal of the first transistor 12, and the anode terminal of the diode Do is connected to the first transmitting terminal $PC_n$ of the battery state monitoring circuit $BMA_n$.

With the battery device configured as described above, as in the second embodiment, the occurrence of the discharge leak current can be prevented, and the disruption of the voltage balance between the batteries as in the conventional technology does not occur. As a result, it is possible to eliminate the load on the user such as the costs and time required for battery exchange. Also, because it is unnecessary to provide the discharge leak current prevention diode within the battery state monitoring circuit, it is possible to reduce the costs and downsize the circuit.

Ninth Embodiment

Figure 11:
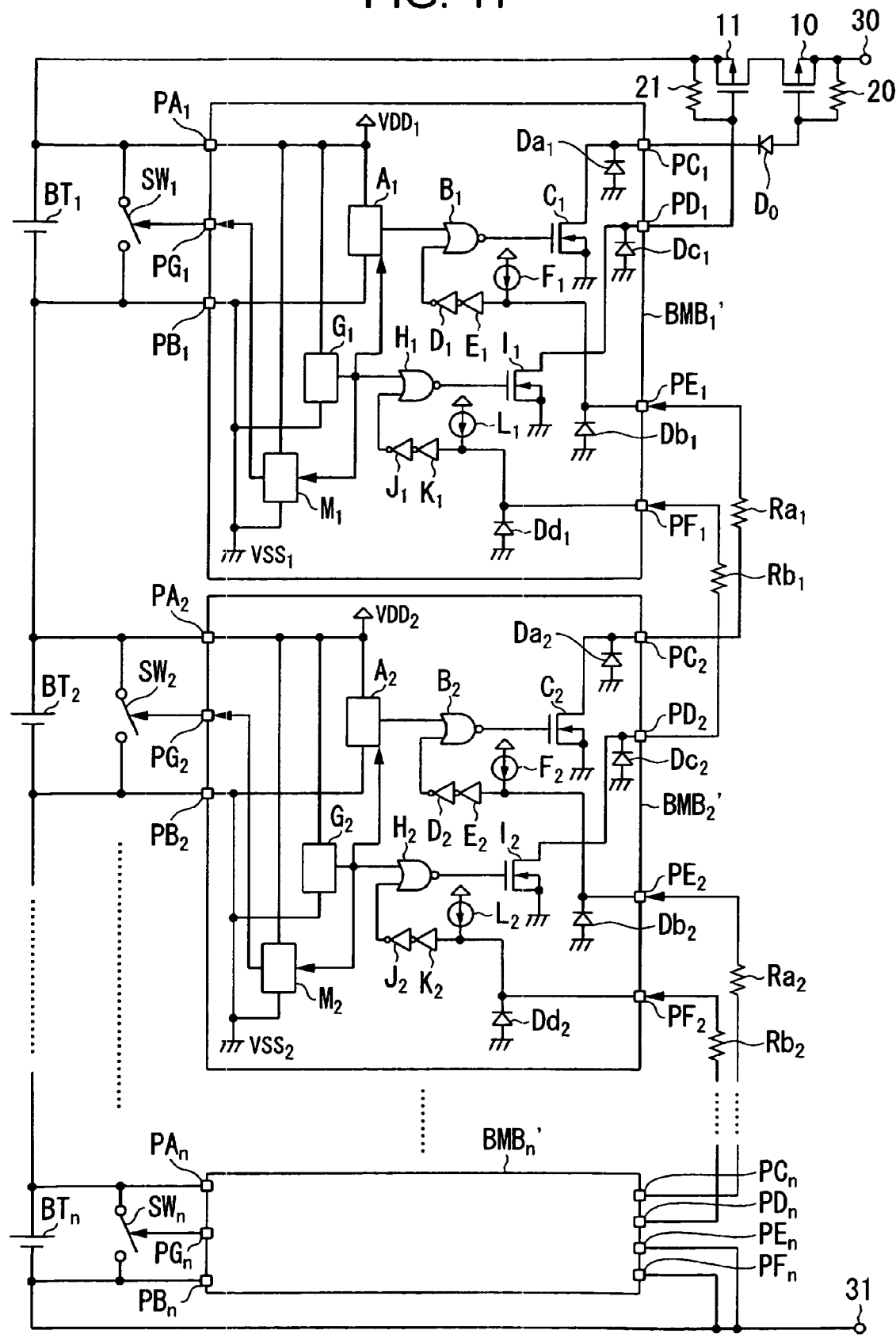
FIG. 11 is a circuit configuration diagram showing a battery device according to a ninth embodiment of the present invention.

Subsequently, a description will be given of a battery device according to a ninth embodiment. FIG. 11 is a circuit configuration diagram showing the battery device according to the ninth embodiment. As shown in the figure, the ninth embodiment is directed to the battery device in which the discharge leak current prevention diodes $Do_1$ to $Do_n$ are not disposed in the respective battery state monitoring circuits $BMB_1$ to $BMB_n$ of the third embodiment. In order to distinguish from the third embodiment, the symbols of the battery state monitoring circuits in the ninth embodiment are denoted by $BMB_1'$ to $BMB_n'$. In the ninth embodiment, the discharge leak current prevention diode Do is disposed in the exterior of the battery state monitoring circuits $BMB_1'$ to $BMB_n'$. Specifically, the anode terminal of the diode Do is connected to the gate terminal of the first transistor 10, and the cathode terminal of the diode Do is connected to the first transmitting terminal $PC_1$ of the battery state monitoring circuit $BMB_1$.

With the battery device configured as described above, as in the third embodiment, the occurrence of the discharge leak current can be prevented, and the disruption of the voltage balance between the batteries as in the conventional technology does not occur. As a result, it is possible to eliminate the load on the user such as the costs and time required for battery exchange. Also, because it is unnecessary to provide the discharge leak current prevention diode within the battery state monitoring circuit, it is possible to reduce the costs and downsize the circuit.

Tenth Embodiment

Figure 12:
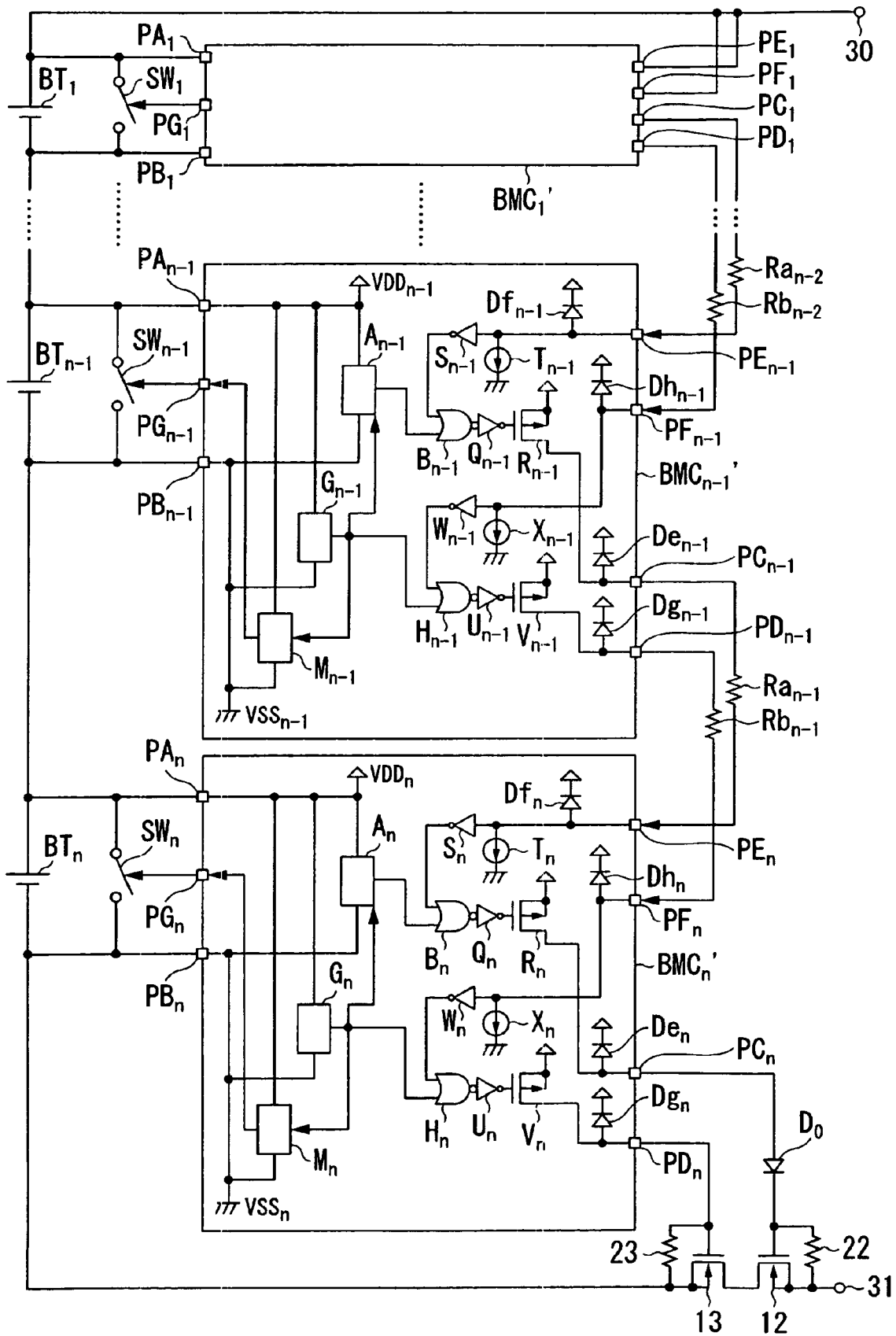
FIG. 12 is a circuit configuration diagram showing a battery device according to a tenth embodiment of the present invention.

Subsequently, a description will be given of a battery device according to a tenth embodiment. FIG. 12 is a circuit configuration diagram showing the battery device according to the tenth embodiment. As shown in the figure, the tenth embodiment is directed to the battery device in which the discharge leak current prevention diodes $Do_1$ to $Do_n$ are not disposed in the respective battery state monitoring circuits $BMC_1$ to $BMC_n$ of the fourth embodiment. In order to distinguish from the fourth embodiment, the symbols of the battery state monitoring circuits in the tenth embodiment are denoted by $BMC_1'$ to $BMC_n'$. In the tenth embodiment, the discharge leak current prevention diode Do is disposed in the exterior of the battery state monitoring circuits $BMC_1'$ to $BMC_n'$. Specifically, the cathode terminal of the diode Do is connected to the gate terminal of the first transistor 12, and the anode terminal of the diode Do is connected to the first transmitting terminal $PC_n$ of the battery state monitoring circuit $BMC_n$.

With the battery device configured as described above, as in the fourth embodiment, the occurrence of the discharge leak current can be prevented, and the disruption of the voltage balance between the batteries as in the conventional technology does not occur. As a result, it is possible to eliminate the load on the user such as the costs and time required for battery exchange. Also, because it is unnecessary to provide the discharge leak current prevention diode within the battery state monitoring circuit, it is possible to reduce the costs and downsize the circuit.

Eleventh Embodiment

Figure 13:
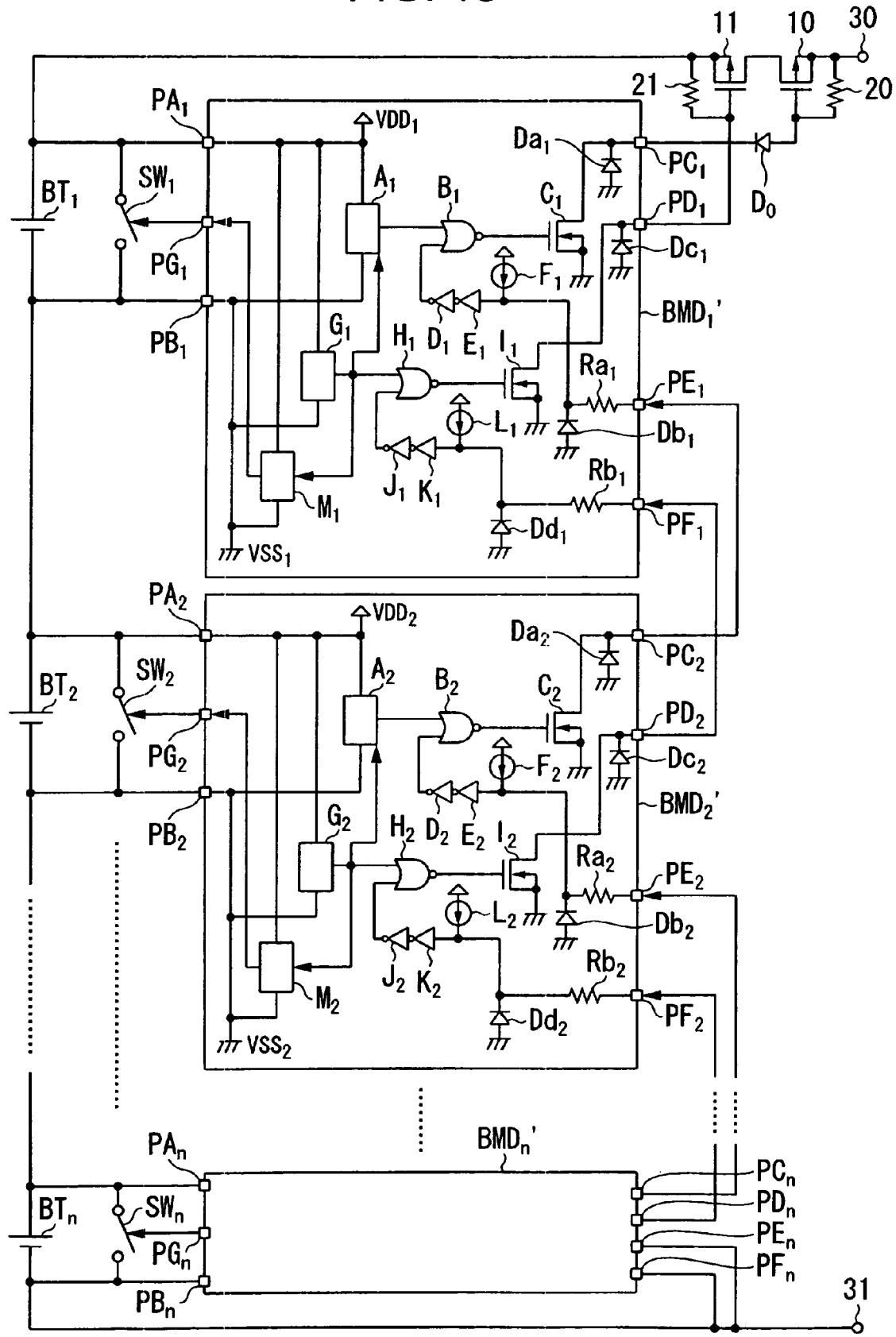
FIG. 13 is a circuit configuration diagram showing a battery device according to an eleventh embodiment of the present invention.

Subsequently, a description will be given of a battery device according to an eleventh embodiment. FIG. 13 is a circuit configuration diagram showing the battery device according to the eleventh embodiment. As shown in the figure, the eleventh embodiment is directed to the battery device in which the discharge leak current prevention diodes $Do_1$ to $Do_n$ are not disposed in the respective battery state monitoring circuits $BMD_1$ to $BMD_n$ of the fifth embodiment. In order to distinguish from the fifth embodiment, the symbols of the battery state monitoring circuits in the eleventh embodiment are denoted by $BMD_1'$ to $BMD_n'$. In the eleventh embodiment, the discharge leak current prevention diode Do is disposed in the exterior of the battery state monitoring circuits $BMD_1'$ to $BMD_n'$. Specifically, the anode terminal of the diode Do is connected to the gate terminal of the first transistor 10, and the cathode terminal of the diode Do is connected to the first transmitting terminal $PC_1$ of the battery state monitoring circuit $BMD_1$.

With the battery device configured as described above, as in the fifth embodiment, the occurrence of the discharge leak current can be prevented, and the disruption of the voltage balance between the batteries as in the conventional technology does not occur. As a result, it is possible to eliminate the load on the user such as the costs and time required for battery exchange. Also, because it is unnecessary to provide the discharge leak current prevention diode within the battery state monitoring circuit, it is possible to reduce the costs and downsize the circuit.

Twelfth Embodiment

Figure 14:
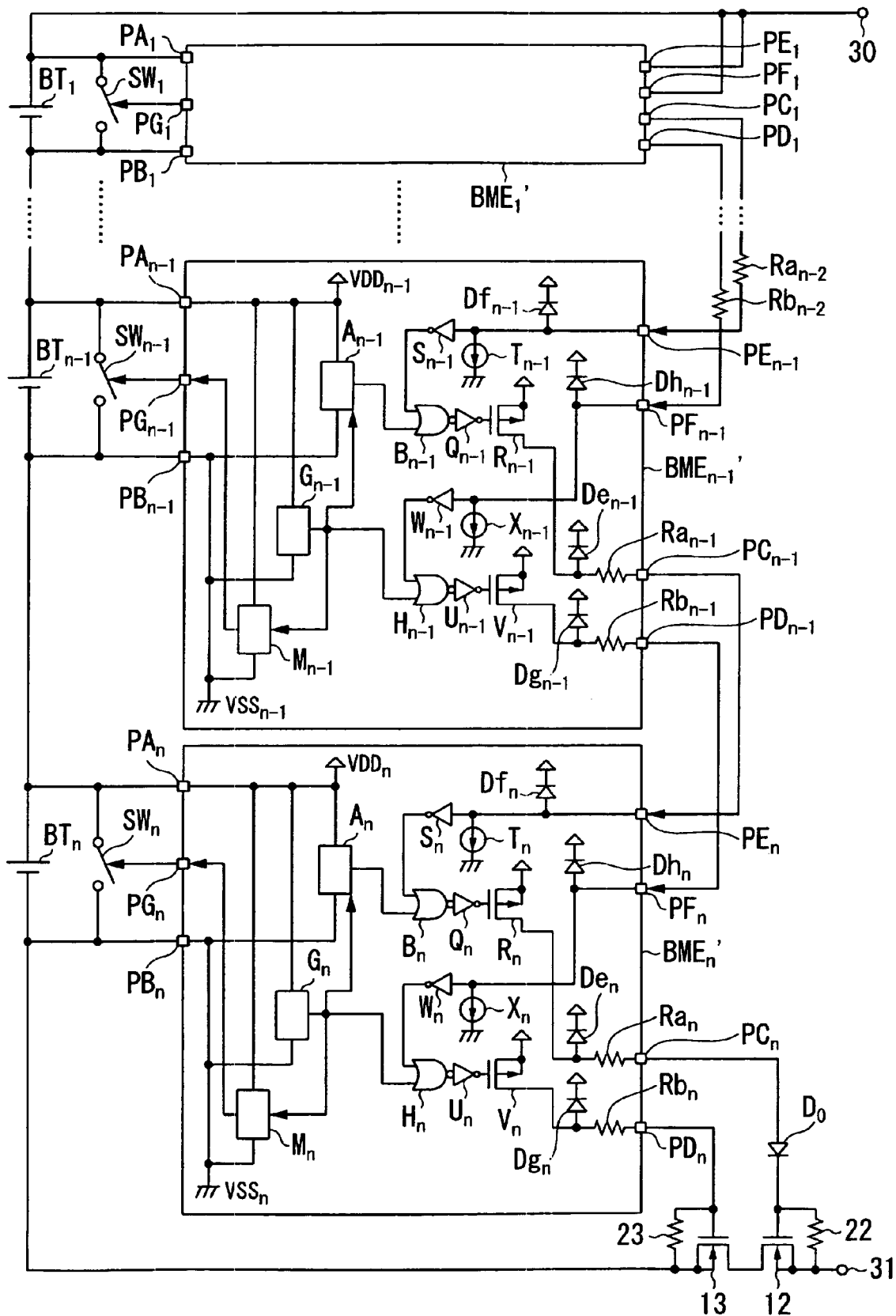
FIG. 14 is a circuit configuration diagram showing a battery device according to a twelfth embodiment of the present invention.
Figure 15A:
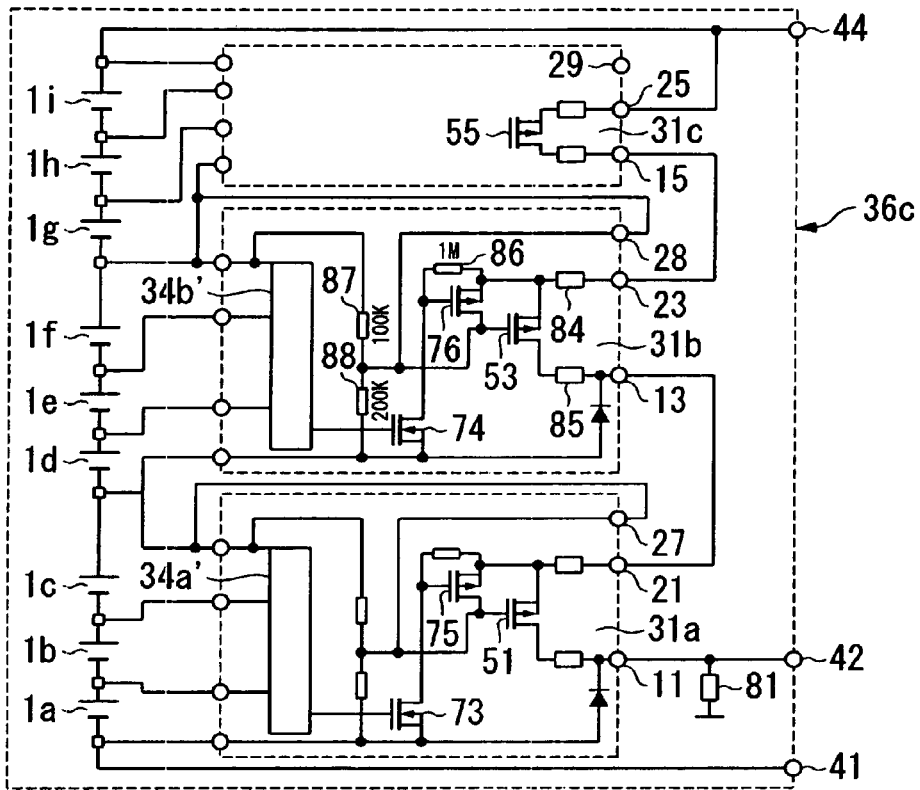
FIG. 15 is an explanatory diagram showing a conventional technology.
Figure 15B:
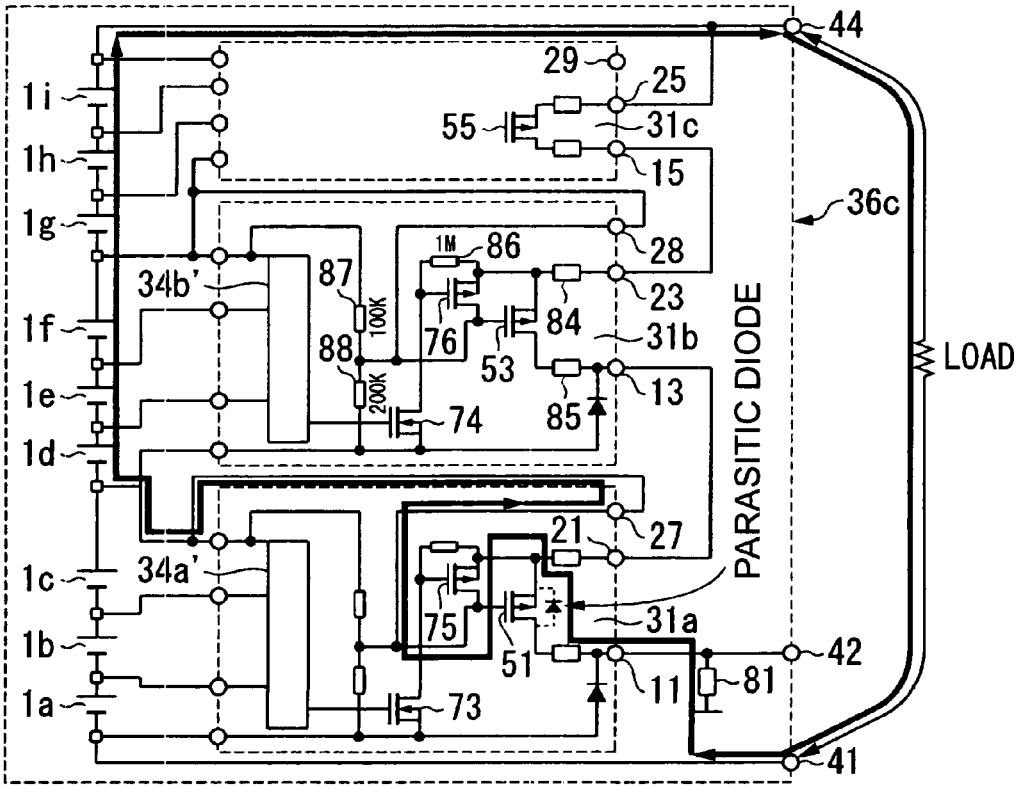

Subsequently, a description will be given of a battery device according to a twelfth embodiment. FIG. 14 is a circuit configuration diagram showing the battery device according to the twelfth embodiment. As shown in the figure, the twelfth embodiment is directed to the battery device in which the discharge leak current prevention diodes $Do_1$ to $Do_n$ are not disposed in the respective battery state monitoring circuits $BME_1$ to $BME_n$ of the sixth embodiment. In order to distinguish from the sixth embodiment, the symbols of the battery state monitoring circuits in the twelfth embodiment are denoted by $BME_1'$ to $BME_n'$. In the twelfth embodiment, the discharge leak current prevention diode Do is disposed in the exterior of the battery state monitoring circuits $BME_1'$ to $BAE_n'$. Specifically, the cathode terminal of the diode Do is connected to the gate terminal of the first transistor 12, and the anode terminal of the diode Do is connected to the first transmitting terminal $PC_n$ of the battery state monitoring circuit $BME_n$.

With the battery device configured as described above, as in the sixth embodiment, the occurrence of the discharge leak current can be prevented, and the disruption of the voltage balance between the batteries as in the conventional technology does not occur. As a result, it is possible to eliminate the load on the user such as the costs and time required for battery exchange. Also, because it is unnecessary to provide the discharge leak current prevention diode within the battery state monitoring circuit, it is possible to reduce the costs and downsize the circuit.

What is claimed is:

1. A battery state monitoring circuit, comprising:
a battery state detector circuit that detects a state of a battery based on a voltage of the battery;
a transmitting terminal that transmits battery state information indicative of the state of the battery to an outside;
a receiving terminal that receives battery state information of another battery from the outside;
a transistor that is used for transmitting the battery state information, and has any one of two terminals except for a control terminal connected to the transmitting terminal; and
a diode that is connected in a direction opposite to a direction of a parasitic diode disposed between the two terminals of the transistor, the diode being disposed between the transmitting terminal and one terminal of the transistor.

2. A battery state monitoring circuit according to claim 1, further comprising:
a first voltage monitor terminal that is used for connection with a positive terminal of the battery and connected to an internal positive side common power source wire;
a second voltage monitor terminal that is used for connection with a negative terminal of the battery and connected to an internal negative side common power source wire;
a first transmitting terminal;
a second transmitting terminal;
a first receiving terminal;
a second receiving terminal;
a cell balance control terminal;
an overcharge detector circuit that detects whether or not the battery is overcharged based on a voltage between the first voltage monitor terminal and the second voltage monitor terminal, and outputs an overcharge detection signal indicative of a detection result in question as the battery state detector circuit;
an overdischarge detector circuit that detects whether or not the battery is overdischarged based on the voltage between the first voltage monitor terminal and the second voltage monitor terminal, and outputs an overdischarge detection signal indicative of a detection result in question as the battery state detector circuit;
a cell balance circuit that detects whether or not the battery needs to be subjected to cell balance control based on the voltage between the first voltage monitor terminal and the second voltage monitor terminal, and outputs a cell balance signal indicative of a detection result in question to the cell balance control terminal as the battery state detector circuit;
a first logical inversion circuit;
a second logical inversion circuit having an output terminal connected to an input terminal of the first logical inversion circuit, and an input terminal connected to the first receiving terminal;
a first current source having an input terminal connected to the internal positive side common power source wire, and an output terminal connected to the first receiving terminal;
a first negative OR circuit that receives the overcharge detection signal and an output signal of the first logical inversion circuit, and outputs a negative OR signal of the overcharge detection signal and the output signal of the first logical inversion circuit;
a first n-channel type transistor having a gate terminal receiving the negative OR signal of the overdischarge detection signal and the output signal of the first logical inversion circuit, a drain terminal connected to a cathode terminal of the diode, and a source terminal connected to the internal negative side common power source wire;
a third logical inversion circuit;
a fourth logical inversion circuit having an output terminal connected to an input terminal of the third logical inversion circuit, and an input terminal connected to the second receiving terminal;
a second current source having an input terminal connected to the internal positive side common power source wire, and an output terminal connected to the second receiving terminal;
a second negative OR circuit that receives the overdischarge detection signal and an output signal of the third logical inversion circuit, and outputs a negative OR signal of the overcharge detection signal and the output signal of the third logical inversion circuit; and
a second n-channel type transistor having a gate terminal receiving the negative OR signal the overdischarge detection signal and the output signal of the third logical inversion circuit, a drain terminal connected to the second transmitting terminal, and a source terminal connected to the internal negative side common power source wire,
wherein the diode has an anode terminal connected to the first transmitting terminal, and
wherein the battery state monitoring circuit is constituted as one semiconductor device.

3. A battery state monitoring circuit according to claim 1, further comprising:
a first voltage monitor terminal that is used for connection with a positive terminal of the battery and connected to an internal positive side common power source wire;
a second voltage monitor terminal that is used for connection with a negative terminal of the battery and connected to an internal negative side common power source wire;
a first transmitting terminal;
a second transmitting terminal;
a first receiving terminal;
a second receiving terminal;
a cell balance control terminal;
an overcharge detector circuit that detects whether or not the battery is overcharged based on a voltage between the first voltage monitor terminal and the second voltage monitor terminal, and outputs an overcharge detection signal indicative of a detection result in question as the battery state detector circuit;
an overdischarge detector circuit that detects whether or not the battery is overdischarged based on the voltage between the first voltage monitor terminal and the second voltage monitor terminal, and outputs an overdischarge detection signal indicative of a detection result in question as the battery state detector circuit;
a cell balance circuit that detects whether or not the battery needs to be subjected to cell balance control based on the voltage between the first voltage monitor terminal and the second voltage monitor terminal, and outputs a cell balance signal indicative of a detection result in question to the cell balance control terminal as the battery state detector circuit;
a first logical inversion circuit;
a first p-channel type transistor having a gate terminal receiving an output signal of the first logical inversion circuit, a drain terminal connected to an anode terminal of the diode, and a source terminal connected to the internal positive side common power source wire;

a first current source having an input terminal connected to the first receiving terminal, and an output terminal connected to the internal negative side common power source wire;

a second logical inversion circuit having an input terminal connected to the first receiving terminal;

a first negative OR circuit that receives the overcharge detection signal and an output signal of the second logical inversion circuit, and outputs a negative OR signal of the overcharge detection signal and the output signal of the second logical inversion circuit to the first logical inversion circuit;

a third logical inversion circuit;

a second p-channel type transistor having a gate terminal receiving an output signal of the third logical inversion circuit, a drain terminal connected to the second transmitting terminal, and a source terminal connected to the internal positive side common power source wire;

a second current source having an input terminal connected to the second receiving terminal, and an output terminal connected to the internal negative side common power source wire;

a fourth logical inversion circuit having an input terminal connected to the second receiving terminal; and a second negative OR circuit that receives the overdischarge detection signal and an output signal of the fourth logical inversion circuit, and outputs a negative OR signal of the overdischarge detection signal and the output signal of the fourth logical inversion circuit to the third logical inversion circuit, wherein the diode has a cathode terminal connected to the first transmitting terminal, and wherein the battery state monitoring circuit is constituted as one semiconductor device.

4. A battery state monitoring circuit according to claim 2, further comprising:

a first clamp diode that has an anode terminal connected to the internal negative side common power source wire, and a cathode terminal connected to the drain terminal of the first n-channel type transistor, and has a characteristic that allows a reverse current to flow in the first clamp diode when a reverse voltage corresponding to a voltage which exceeds a withstand voltage of the battery state monitoring circuit is applied to the first clamp diode;

a second clamp diode that has an anode terminal connected to the internal negative side common power source wire, and a cathode terminal connected to the output terminal of the first current source;

a third clamp diode that has an anode terminal connected to the internal negative side common power source wire, and a cathode terminal connected to the drain terminal of the second n-channel type transistor, and has a characteristic that allows the reverse current to flow in the third clamp diode when the reverse voltage corresponding to the voltage which exceeds the withstand voltage of the battery state monitoring circuit is applied to the third clamp diode; and a fourth clamp diode that has an anode terminal connected to the internal negative side common power source wire, and a cathode terminal connected to the output terminal of the second current source.

5. A battery state monitoring circuit according to claim 3, further comprising:

a first clamp diode that has an anode terminal connected to the drain terminal of the first p-channel type transistor, and a cathode terminal connected to the internal positive side common power source wire, and has a characteristic that allows a reverse current to flow in the first clamp diode when a reverse voltage corresponding to a voltage which exceeds a withstand voltage of the battery state monitoring circuit is applied to the first clamp diode;

a second clamp diode that has an anode terminal connected to the input terminal of the first current source, and a cathode terminal connected to the internal positive side common power source wire;

a third clamp diode that has an anode terminal connected to the drain terminal of the second p-channel type transistor, and a cathode terminal connected to the internal positive side common power source wire, and has a characteristic that allows the reverse current to flow in the third clamp diode when the reverse voltage corresponding to the voltage which exceeds the withstand voltage of the battery state monitoring circuit is applied to the third clamp diode; and a fourth clamp diode that has an anode terminal connected to the input terminal of the second current source, and a cathode terminal connected to the internal positive side common power source wire.

6. A battery state monitoring circuit according to claim 4, further comprising:

a first resistive element that is connected between the cathode terminal of the second clamp diode and the first receiving terminal; and a second resistive element that is connected between the cathode terminal of the fourth clamp diode and the second receiving terminal.

7. A battery state monitoring circuit according to claim 5, further comprising:

a first resistive element that is connected between the anode terminal of the first clamp diode and the first transmitting terminal; and a second resistive element that is connected between the anode terminal of the third clamp diode and the second transmitting terminal.

8. A battery device, comprising:

a plurality of batteries that are connected in series;

the battery state monitoring circuit according to claim 1, which is disposed in correspondence with each of the plurality of batteries; and a switch circuit that switches between permission and prohibition of charging and discharging of the plurality of batteries, wherein the transmitting terminal of the battery state monitoring circuit is connected to the receiving terminal of one of the adjacent battery state monitoring circuits, and the receiving terminal of the battery state monitoring circuit is connected to the transmitting terminal of another one of the adjacent battery state monitoring circuits, and wherein the switch circuit switches between the permission and the prohibition of the charging and the discharging based on the battery state information that is transmitted from the transmitting terminal of the battery state monitoring circuit corresponding to a battery at one end of the plurality of batteries that are connected in series.

9. A battery device, comprising:
a plurality of batteries that are connected in series;
the battery state monitoring circuit according to claim 2 or 6, which is disposed in correspondence with each of the plurality of batteries;
a cell balance switch circuit that is connected in parallel with the each of the plurality of batteries, and switches between connection and disconnection of two terminals according to the cell balance signal that is output from the cell balance control terminal of the battery state monitoring circuit which corresponds to the each of the plurality of batteries;
a first external terminal;
a second external terminal;
a charging p-channel type transistor;
a discharging p-channel type transistor;
a first bias resistive element having one end connected to a gate terminal of the charging p-channel type transistor, and another end connected to a source terminal of the charging p-channel type transistor; and
a second bias resistive element having one end connected to a gate terminal of the discharging p-channel type transistor, and another end connected to a source terminal of the discharging p-channel type transistor,
wherein the battery state monitoring circuit has the first voltage monitor terminal connected to the positive terminal of a corresponding battery, respectively, the second voltage monitor terminal connected to the negative terminal of the corresponding battery, respectively, the first transmitting terminal connected to the first receiving terminal of one of the adjacent battery state monitoring circuits, the second transmitting terminal connected to the second receiving terminal of the one of the adjacent battery state monitoring circuits, the first receiving terminal connected to the first transmitting terminal of another one of the adjacent battery state monitoring circuits, and the second receiving terminal connected to the second transmitting terminal of the another one of the adjacent battery state monitoring circuits,
wherein the battery state monitoring circuit corresponding to a battery at one end of the plurality of batteries that are connected in series has the first transmitting terminal connected to the gate terminal of the charging p-channel type transistor, and the second transmitting terminal connected to the gate terminal of the discharging p-channel type transistor,
wherein the discharging p-channel type transistor has the source terminal connected to the positive terminal of the battery at the one end, and a drain terminal connected to a drain terminal of the charging p-channel type transistor, and the charging p-channel type transistor has the source terminal connected to the first external terminal,
wherein a battery at another end of the plurality of batteries that are connected in series has the negative terminal connected to the second external terminal, and
wherein the battery state monitoring circuit corresponding to the battery at the another end has the first receiving terminal and the second receiving terminal connected to the negative terminal of the battery at the another end.

10. A battery device, comprising:
a plurality of batteries that are connected in series;
the battery state monitoring circuit according to claim 3 or 7, which is disposed in correspondence with each of the plurality of batteries;
a cell balance switch circuit that is connected in parallel with the each of the plurality of batteries, and switches between connection and disconnection of two terminals according to the cell balance signal that is output from the cell balance control terminal of the battery state monitoring circuit which corresponds to the each of the plurality of batteries;
a first external terminal;
a second external terminal;
a charging n-channel type transistor;
a discharging n-channel type transistor;
a first bias resistive element having one end connected to a gate terminal of the charging n-channel type transistor, and another end connected to a source terminal of the charging n-channel type transistor; and
a second bias resistive element having one end connected to a gate terminal of the discharging n-channel type transistor, and another end connected to a source terminal of the discharging n-channel type transistor,
wherein the battery state monitoring circuit has the first voltage monitor terminal connected to the positive terminal of a corresponding battery, respectively, the second voltage monitor terminal connected to the negative terminal of the corresponding battery, respectively, the first transmitting terminal connected to the first receiving terminal of one of the adjacent battery state monitoring circuits, the second transmitting terminal connected to the second receiving terminal of the one of the adjacent battery state monitoring circuits, the first receiving terminal connected to the first transmitting terminal of another one of the adjacent battery state monitoring circuits, and the second receiving terminal connected to the second transmitting terminal of the another one of the adjacent battery state monitoring circuits,
wherein a battery at one end of the plurality of batteries that are connected in series has the positive terminal connected to the first external terminal,
wherein the battery state monitoring circuit corresponding to the battery at the one end has the first receiving terminal and the second receiving terminal connected to the positive terminal of the battery at the one end,
wherein the battery state monitoring circuit corresponding to a battery at another end of the plurality of batteries that are connected in series has the first transmitting terminal connected to the gate terminal of the charging n-channel type transistor, and the second transmitting terminal connected to the gate terminal of the discharging n-channel type transistor, and
wherein the discharging n-channel type transistor has the source terminal connected to the negative terminal of the battery at the another end, and a drain terminal connected to a drain terminal of the charging n-channel type transistor, and the charging n-channel type transistor has the source terminal connected to the second external terminal.

11. A battery device, comprising:
a plurality of batteries that are connected in series;
the battery state monitoring circuit according to claim 4, which is disposed in correspondence with each of the plurality of batteries;
a cell balance switch circuit that is connected in parallel with the each of the plurality of batteries, and switches between connection and disconnection of two terminals according to the cell balance signal that is output from the cell balance control terminal of the battery state monitoring circuit which corresponds to the each of the plurality of batteries;
a first external terminal;

a second external terminal;
a charging p-channel type transistor;
a discharging p-channel type transistor;
a first bias resistive element having one end connected to a gate terminal of the charging p-channel type transistor, and another end connected to a source terminal of the charging p-channel type transistor; and
a second bias resistive element having one end connected to a gate terminal of the discharging p-channel type transistor, and another end connected to a source terminal of the discharging p-channel type transistor,
wherein the battery state monitoring circuit has the first voltage monitor terminal connected to the positive terminal of a corresponding battery, respectively, the second voltage monitor terminal connected to the negative terminal of the corresponding battery, respectively, the first transmitting terminal connected to the first receiving terminal of one of the adjacent battery state monitoring circuits through a resistive element, the second transmitting terminal connected to the second receiving terminal of the one of the adjacent battery state monitoring circuits through the resistive element, the first receiving terminal connected to the first transmitting terminal of another one of the adjacent battery state monitoring circuits through the resistive element, and the second receiving terminal connected to the second transmitting terminal of the another one of the adjacent battery state monitoring circuits through the resistive element,
wherein the battery state monitoring circuit corresponding to a battery at one end of the plurality of batteries that are connected in series has the first transmitting terminal connected to the gate terminal of the charging p-channel type transistor, and the second transmitting terminal connected to the gate terminal of the discharging p-channel type transistor,
wherein the discharging p-channel type transistor has the source terminal connected to the positive terminal of the battery at the one end, and a drain terminal connected to a drain terminal of the charging p-channel type transistor, the charging p-channel type transistor has the source terminal connected to the first external terminal, and a battery at another end of the plurality of batteries that are connected in series has the negative terminal connected to the second external terminal, and
wherein the battery state monitoring circuit corresponding to the battery at the another end has the first receiving terminal and the second receiving terminal connected to the negative terminal of the battery at the another end.

12. A battery device, comprising:
a plurality of batteries that are connected in series;
the battery state monitoring circuit according to claim 5, which is disposed in correspondence with each of the plurality of batteries;
a cell balance switch circuit that is connected in parallel with the each of the plurality of batteries, and switches between connection and disconnection of two terminals according to the cell balance signal that is output from the cell balance control terminal of the battery state monitoring circuit which corresponds to the each of the plurality of batteries;
a first external terminal;
a second external terminal;
a charging n-channel type transistor;
a discharging n-channel type transistor;
a first bias resistive element having one end connected to a gate terminal of the charging n-channel type transistor, and another end connected to a source terminal of the charging n-channel type transistor; and
a second bias resistive element having one end connected to a gate terminal of the discharging n-channel type transistor, and another end connected to a source terminal of the discharging n-channel type transistor,
wherein the battery state monitoring circuit has the first voltage monitor terminal connected to the positive terminal of a corresponding battery, respectively, the second voltage monitor terminal connected to the negative terminal of the corresponding battery, respectively, the first transmitting terminal connected to the first receiving terminal of one of the adjacent battery state monitoring circuits through a resistive element, the second transmitting terminal connected to the second receiving terminal of the one of the adjacent battery state monitoring circuits through the resistive element, the first receiving terminal connected to the first transmitting terminal of another one of the adjacent battery state monitoring circuits through the resistive element, and the second receiving terminal connected to the second transmitting terminal of the another one of the adjacent battery state monitoring circuits through the resistive element,
wherein a battery at one end of the plurality of batteries that are connected in series has the positive terminal connected to the first external terminal,
wherein the battery state monitoring circuit corresponding to the battery at the one end has the first receiving terminal and the second receiving terminal connected to the positive terminal of the battery at the one end,
wherein the battery state monitoring circuit corresponding to a battery at another end of the plurality of batteries that are connected in series has the first transmitting terminal connected to the gate terminal of the charging n-channel type transistor, and the second transmitting terminal connected to the gate terminal of the discharging n-channel type transistor, and
wherein the discharging n-channel type transistor has the source terminal connected to the negative terminal of the battery at the another end, and a drain terminal connected to a drain terminal of the charging n-channel type transistor, and the charging n-channel type transistor has the source terminal connected to the second external terminal.

13. A battery device, comprising:
a plurality of batteries that are connected in series;
a battery state monitoring circuit that is disposed in correspondence with each of the plurality of batteries, the battery state monitoring circuit comprising:
  a first voltage monitor terminal that is used for connection with a positive terminal of one of the plurality of batteries and connected to an internal positive side common power source wire;
  a second voltage monitor terminal that is used for connection with a negative terminal of the one of the plurality of batteries and connected to an internal negative side common power source wire;
  a first transmitting terminal;
  a second transmitting terminal;
  a first receiving terminal;
  a second receiving terminal;
  a cell balance control terminal;
  an overcharge detector circuit that detects whether or not the one of the plurality of batteries is overcharged based on a voltage between the first voltage monitor terminal and the second voltage monitor terminal, and outputs an overcharge detection signal indicative of a detection result in question;

an overdischarge detector circuit that detects whether or not the one of the plurality of batteries is overdischarged based on the voltage between the first voltage monitor terminal and the second voltage monitor terminal, and outputs an overdischarge detection signal indicative of a detection result in question;

a cell balance circuit that detects whether or not the one of the plurality of batteries needs to be subjected to cell balance control based on the voltage between the first voltage monitor terminal and the second voltage monitor terminal, and outputs a cell balance signal indicative of a detection result in question to the cell balance control terminal;

a first logical inversion circuit;

a second logical inversion circuit having an output terminal connected to an input terminal of the first logical inversion circuit, and an input terminal connected to the first receiving terminal;

a first current source having an input terminal connected to the internal positive side common power source wire, and an output terminal connected to the first receiving terminal;

a first negative OR circuit that receives the overcharge detection signal and an output signal of the first logical inversion circuit, and outputs a negative OR signal of the overcharge detection signal and the output signal of the first logical inversion circuit;

a first n-channel type transistor having a gate terminal receiving the negative OR signal of the overcharge detection signal and the output signal of the first logical inversion circuit, a drain terminal connected to the first transmitting terminal, and a source terminal connected to the internal negative side common power source wire;

a third logical inversion circuit;

a fourth logical inversion circuit having an output terminal connected to an input terminal of the third logical inversion circuit, and an input terminal connected to the second receiving terminal;

a second current source having an input terminal connected to the internal positive side common power source wire, and an output terminal connected to the second receiving terminal;

a second negative OR circuit that receives the overdischarge detection signal and an output signal of the third logical inversion circuit, and outputs a negative OR signal of the overdischarge detection signal and the output signal of the third logical inversion circuit; and a second n-channel type transistor having a gate terminal receiving the negative OR signal of the overdischarge detection signal and the output signal of the third logical inversion circuit, a drain terminal connected to the second transmitting terminal, and a source terminal connected to the internal negative side common power source wire;

a cell balance switch circuit that is connected in parallel with the each of the plurality of batteries, and switches between connection and disconnection of two terminals according to the cell balance signal that is output from the cell balance control terminal of the battery state monitoring circuit corresponding to the each of the plurality of batteries;

a first external terminal;

a second external terminal;

a charging p-channel type transistor;

a discharging p-channel type transistor;

a first bias resistive element having one end connected to a gate terminal of the charging p-channel type transistor, and another end connected to a source terminal of the charging p-channel type transistor;

a second bias resistive element having one end connected to a gate terminal of the discharging p-channel type transistor, and another end connected to a source terminal of the discharging p-channel type transistor; and a diode having an anode terminal connected to the gate terminal of the charging p-channel type transistor, wherein the battery state monitoring circuit has the first voltage monitor terminal connected to the positive terminal of a corresponding battery, respectively, the second voltage monitor terminal connected to the negative terminal of the corresponding battery, respectively, the first transmitting terminal connected to the first receiving terminal of one of the adjacent battery state monitoring circuits, the second transmitting terminal connected to the second receiving terminal of the one of the adjacent battery state monitoring circuits, the first receiving terminal connected to the first transmitting terminal of another one of the adjacent battery state monitoring circuits, and the second receiving terminal connected to the second transmitting terminal of the another one of the adjacent battery state monitoring circuits, wherein the battery state monitoring circuit corresponding to a battery at one end of the plurality of batteries that are connected in series has the first transmitting terminal connected to a cathode terminal of the diode, and the second transmitting terminal connected to the gate terminal of the discharging p-channel type transistor, wherein the discharging p-channel type transistor has the source terminal connected to the positive terminal of the battery at the one end, and a drain terminal connected to a drain terminal of the charging p-channel type transistor, the charging p-channel type transistor has the source terminal connected to the first external terminal, and a battery at another end of the plurality of batteries that are connected in series has the negative terminal connected to the second external terminal, and wherein the battery state monitoring circuit corresponding to the battery at the another end has the first receiving terminal and the second receiving terminal connected to the negative terminal of the battery at the another end.

14. A battery device, comprising:

a plurality of batteries that are connected in series;

a battery state monitoring circuit that is disposed in correspondence with each of the plurality of batteries, the battery state monitoring circuit comprising:

a first voltage monitor terminal that is used for connection with a positive terminal of one of the plurality of batteries and connected to an internal positive side common power source wire;

a second voltage monitor terminal that is used for connection with a negative terminal of the one of the plurality of batteries and connected to an internal negative side common power source wire;

a first transmitting terminal;

a second transmitting terminal;

a first receiving terminal;

a second receiving terminal;

a cell balance control terminal;

an overcharge detector circuit that detects whether or not the one of the plurality of batteries is overcharged based on a voltage between the first voltage monitor terminal and the second voltage monitor terminal, and outputs an overcharge detection signal indicative of a detection result in question;

an overdischarge detector circuit that detects whether or not the one of the plurality of batteries is overdischarged based on the voltage between the first voltage monitor terminal and the second voltage monitor terminal, and outputs an overdischarge detection signal indicative of a detection result in question;

a cell balance circuit that detects whether or not the one of the plurality of batteries needs to be subjected to cell balance control based on the voltage between the first voltage monitor terminal and the second voltage monitor terminal, and outputs a cell balance signal indicative of a detection result in question to the cell balance control terminal;

a first logical inversion circuit;

a first p-channel type transistor having a gate terminal receiving an output signal of the first logical inversion circuit, a drain terminal connected to the first transmitting terminal, and a source terminal connected to the internal positive side common power source wire;

a first current source having an input terminal connected to the first receiving terminal, and an output terminal connected to the internal negative side common power source wire;

a second logical inversion circuit having an input terminal connected to the first receiving terminal;

a first negative OR circuit that receives the overcharge detection signal and an output signal of the second logical inversion circuit, and outputs a negative OR signal of the overcharge detection signal and the output signal of the second logical inversion circuit to the first logical inversion circuit;

a third logical inversion circuit;

a second p-channel type transistor having a gate terminal receiving an output signal of the third logical inversion circuit, a drain terminal connected to the second transmitting terminal, and a source terminal connected to the internal positive side common power source wire;

a second current source having an input terminal connected to the second receiving terminal, and an output terminal connected to the internal negative side common power source wire;

a fourth logical inversion circuit having an input terminal connected to the second receiving terminal; and a second negative OR circuit that receives the overdischarge detection signal and an output signal of the fourth logical inversion circuit, and outputs a negative OR signal of the overdischarge detection signal and the output signal of the fourth logical inversion circuit to the third logical inversion circuit;

a cell balance switch circuit that is connected in parallel with the each of the plurality of batteries, and switches between connection and disconnection of two terminals according to the cell balance signal that is output from the cell balance control terminal of the battery state monitoring circuit corresponding to the each of the plurality of batteries;

a first external terminal;

a second external terminal;

a charging n-channel type transistor;

a discharging n-channel type transistor;

a first bias resistive element having one end connected to a gate terminal of the charging n-channel type transistor, and another end connected to a source terminal of the charging n-channel type transistor;

a second bias resistive element having one end connected to a gate terminal of the discharging n-channel type transistor, and another end connected to a source terminal of the discharging n-channel type transistor; and a diode having a cathode terminal connected to the gate terminal of the charging n-channel type transistor, wherein the battery state monitoring circuit has the first voltage monitor terminal connected to the positive terminal of a corresponding battery, respectively, the second voltage monitor terminal connected to the negative terminal of the corresponding battery, respectively, the first transmitting terminal connected to the first receiving terminal of one of the adjacent battery state monitoring circuits, the second transmitting terminal connected to the second receiving terminal of the one of the adjacent battery state monitoring circuits, the first receiving terminal connected to the first transmitting terminal of another one of the adjacent battery state monitoring circuits, and the second receiving terminal connected to the second transmitting terminal of the another one of the adjacent battery state monitoring circuits, wherein the positive terminal of a battery at one end of the plurality of batteries that are connected in series is connected to the first external terminal, wherein the first receiving terminal and the second receiving terminal of the battery state monitoring circuit corresponding to the battery at the one end are connected to the positive terminal of the battery at the one end, wherein the battery state monitoring circuit corresponding to a battery at another end of the plurality of batteries that are connected in series has the first transmitting terminal connected to an anode terminal of the diode, and the second transmitting terminal connected to the gate terminal of the discharging n-channel type transistor, and wherein the discharging n-channel type transistor has the source terminal connected to the negative terminal of the battery at the another end, and a drain terminal connected to a drain terminal of the charging n-channel type transistor, and the source terminal of the charging n-channel type transistor is connected to the second external terminal.

15. A battery device according to claim 13, wherein the battery state monitoring circuit further comprises:

a first clamp diode that has an anode terminal connected to the internal negative side common power source wire, and a cathode terminal connected to the drain terminal of the first n-channel type transistor, and has a characteristic that allows a reverse current to flow in the first clamp diode when a reverse voltage corresponding to a voltage which exceeds a withstand voltage of the battery state monitoring circuit is applied to the first clamp diode;

a second clamp diode that has an anode terminal connected to the internal negative side common power source wire, and a cathode terminal connected to the output terminal of the first current source;

a third clamp diode that has an anode terminal connected to the internal negative side common power source wire, and a cathode terminal connected to the drain terminal of the second n-channel type transistor, and has a characteristic that allows the reverse current to flow in the third clamp diode when the reverse voltage corresponding to the voltage which exceeds the withstand voltage of the battery state monitoring circuit is applied to the third clamp diode; and a fourth clamp diode that has an anode terminal connected to the internal negative side common power source wire, and a cathode terminal connected to the output terminal of the second current source, wherein the battery state monitoring circuit has the first transmitting terminal connected to the first receiving terminal of one of the adjacent battery state monitoring circuits through a resistive element, the second transmitting terminal connected to the second receiving terminal of the one of the adjacent battery state monitoring circuits through the resistive element, the first receiving terminal connected to the first transmitting terminal of another one of the adjacent battery state monitoring circuits through the resistive element, and the second receiving terminal connected to the second transmitting terminal of the another one of the adjacent battery state monitoring circuits through the resistive element.

16. A battery device according to claim 14, wherein the battery state monitoring circuit further comprises:

a first clamp diode that has an anode terminal connected to the drain terminal of the first p-channel type transistor, and a cathode terminal connected to the internal positive side common power source wire, and has a characteristic that allows a reverse current to flow in the first clamp diode when a reverse voltage corresponding to a voltage which exceeds a withstand voltage of the battery state monitoring circuit is applied to the first clamp diode;

a second clamp diode that has an anode terminal connected to the input terminal of the first current source, and a cathode terminal connected to the internal positive side common power source wire;

a third clamp diode that has an anode terminal connected to the drain terminal of the second p-channel type transistor, and a cathode terminal connected to the internal positive side common power source wire, and has a characteristic that allows the reverse current to flow in the third clamp diode when the reverse voltage corresponding to the voltage which exceeds the withstand voltage of the battery state monitoring circuit is applied to the third clamp diode; and a fourth clamp diode that has an anode terminal connected to the input terminal of the second current source, and a cathode terminal connected to the internal positive side common power source wire, wherein the battery state monitoring circuit has the first transmitting terminal connected to the first receiving terminal of one of the adjacent battery state monitoring circuits through a resistive element, the second transmitting terminal connected to the second receiving terminal of the one of the adjacent battery state monitoring circuits through the resistive element, the first receiving terminal connected to the first transmitting terminal of another one of the adjacent battery state monitoring circuits through the resistive element, and the second receiving terminal connected to the second transmitting terminal of the another one of the adjacent battery state monitoring circuits through the resistive element.

17. A battery device according to claim 13, wherein the battery state monitoring circuit further comprises:

a first clamp diode that has an anode terminal connected to the internal negative side common power source wire, and a cathode terminal connected to the drain terminal of the first n-channel type transistor, and has a characteristic that allows a reverse current to flow in the first clamp diode when a reverse voltage corresponding to a voltage which exceeds a withstand voltage of the battery state monitoring circuit is applied to the first clamp diode;

a second clamp diode that has an anode terminal connected to the internal negative side common power source wire, and a cathode terminal connected to the output terminal of the first current source;

a third clamp diode that has an anode terminal connected to the internal negative side common power source wire, and a cathode terminal connected to the drain terminal of the second n-channel type transistor, and has a characteristic that allows the reverse current to flow in the third clamp diode when the reverse voltage corresponding to the voltage which exceeds the withstand voltage of the battery state monitoring circuit is applied to the third clamp diode;

a fourth clamp diode that has an anode terminal connected to the internal negative side common power source wire, and a cathode terminal connected to the output terminal of the second current source;

a first resistive element that is connected between the cathode terminal of the second clamp diode and the first receiving terminal; and a second resistive element that is connected between the cathode terminal of the fourth clamp diode and the second receiving terminal.

18. A battery device according to claim 14, wherein the battery state monitoring circuit further comprises:

a first clamp diode that has an anode terminal connected to the drain terminal of the first p-channel type transistor, and a cathode terminal connected to the internal positive side common power source wire, and has a characteristic that allows a reverse current to flow in the first clamp diode when a reverse voltage corresponding to a voltage which exceeds a withstand voltage of the battery state monitoring circuit is applied to the first clamp diode;

a second clamp diode that has an anode terminal connected to the input terminal of the first current source, and a cathode terminal connected to the internal positive side common power source wire;

a third clamp diode that has an anode terminal connected to the drain terminal of the second p-channel type transistor, and a cathode terminal connected to the internal positive side common power source wire, and has a characteristic that allows the reverse current to flow in the third clamp diode when the reverse voltage corresponding to the voltage which exceeds the withstand voltage of the battery state monitoring circuit is applied to the third clamp diode;

a fourth clamp diode that has an anode terminal connected to the input terminal of the second current source, and a cathode terminal connected to the internal positive side common power source wire;

a first resistive element that is connected between the anode terminal of the first clamp diode and the first transmitting terminal; and a second resistive element that is connected between the anode terminal of the third clamp diode and the second transmitting terminal.

* * * * *